US007880710B2

(12) United States Patent
Landolt et al.

(10) Patent No.: US 7,880,710 B2
(45) Date of Patent: Feb. 1, 2011

(54) DIFFERENTIAL DRIVE CIRCUIT AND METHOD FOR GENERATING AN A.C. DIFFERENTIAL DRIVE SIGNAL

(75) Inventors: Oliver D. Landolt, Menlo Park, CA (US); Ken A. Nishimura, Fremont, CA (US)

(73) Assignee: Avago Technologies Enterprise IP (Singapore) Pte, Ltd., Singapore (SG)

( * ) Notice: Subject to any disclaimer, the term of this patent is extended or adjusted under 35 U.S.C. 154(b) by 959 days.

(21) Appl. No.: 11/685,330

(22) Filed: Mar. 13, 2007

(65) Prior Publication Data

US 2007/0200601 A1 Aug. 30, 2007

Related U.S. Application Data

(62) Division of application No. 10/000,998, filed on Nov. 30, 2001, now Pat. No. 7,209,108.

(51) Int. Cl.

| | |
|---|---|
| ***G09G 3/36*** | (2006.01) |
| ***G06G 7/20*** | (2006.01) |
| ***G06G 7/22*** | (2006.01) |
| ***G06F 7/556*** | (2006.01) |
| ***H03K 5/22*** | (2006.01) |
| ***H03K 5/153*** | (2006.01) |

(52) U.S. Cl. ............................ 345/98; 345/87; 327/90; 327/347

(58) Field of Classification Search ............ 345/87–90, 345/98–100; 327/90, 94, 141, 151, 347, 327/348

See application file for complete search history.

(56) References Cited

U.S. PATENT DOCUMENTS

| | | | | |
|---|---|---|---|---|
| 4,346,346 A | | 8/1982 | Silberberg | |
| 4,369,504 A | | 1/1983 | Hanmura | |
| 4,908,613 A | * | 3/1990 | Green | 345/90 |
| 5,239,293 A | | 8/1993 | Barbier | |
| 5,977,940 A | | 11/1999 | Akiyama et al. | |
| 6,023,256 A | | 2/2000 | Ng et al. | |

FOREIGN PATENT DOCUMENTS

| | | |
|---|---|---|
| FR | 2 473 767 A | 7/1981 |

* cited by examiner

*Primary Examiner*—Srilakshmi K Kumar

(57) ABSTRACT

The differential drive circuit generates a differential drive signal having a root mean square value defined by a digital input value. The differential drive signal includes a first differential component and a second differential component. The circuit comprises a first differential component generator and a second differential component generator. The first differential component generator is for counting the clock signal to generate successive values of a periodic count. Each of the values includes a most-significant bit. The first differential component generator is additionally for generating the first differential component in response to successive ones of the most-significant bit of the count. The second differential component generator is for generating the second differential component in response to the digital input value and the successive values of the count.

16 Claims, 11 Drawing Sheets

DIFFERENTIAL DRIVE CIRCUIT AND METHOD FOR GENERATING AN A.C. DIFFERENTIAL DRIVE SIGNAL

This is a Divisional of application Ser. No. 10/000,998, filed on Nov. 30, 2001 now U.S. Pat. No. 7,209,108, the entire disclosure of which is incorporated herein by reference.

BACKGROUND OF THE INVENTION

Many types of liquid-crystal (LC) device modify the polarization of light travelling through them in a way that is dependent on the root-mean-square (RMS) amplitude of an applied alternating-current (a.c.) electric field. The a.c. electric field is generated by a drive circuit that applies an a.c. drive signal to the electrodes of the cell. The magnitude of the polarization change is a continuous function of the RMS value of the drive signal. The RMS value of the drive signal is in turn defined by an input value received by the drive circuit.

In conjunction with polarization-selective optical components, LC devices can be used to build useful devices such as displays, optical switches, optical multiplexers and electrically-controllable optical attenuators. Many applications, notably those related to optical communication networks, require the drive circuit to provide a fine control over the electrical drive conditions of the LC device, as well as long-term stability.

Another desirable property of drive circuits for LC devices is that they generate a drive signal that is a pure a.c. signal with little, and preferably no, DC component. Most LC devices are damaged by the long-term application of even a small DC voltage across them.

Analog drive circuits that generate an a.c. drive signal whose RMS value is determined by an analog sample received by the drive circuit are known in the art. An example of such an analog drive circuit for an LC device is described in U.S. Pat. No. 5,977,940 to Akiyama et al. However, in an increasing number of applications, a digital input value is provided as the input signal for the drive circuit. To operate with a digital input value, the conventional analog drive circuit needs to be preceded by a digital-to-analog converter. This substantially increases the complexity of the device incorporating the analog drive circuit.

Thus, what is needed is a simple drive circuit that can generate an a.c. drive signal whose amplitude is defined by a digital input value. What is also needed is a drive circuit that can generate an a.c. drive signal suitable for driving an LC device.

What is also needed for driving LC devices used in display applications is a drive circuit that can generate multiple drive signals, each in response to a respective digital input value, and that is not significantly more complex than a drive circuit that generates a single drive signal.

What is also needed is a drive circuit capable of generating an a.c. drive signal that additionally includes a baseline a.c. component whose amplitude is defined independently of the digital input value. Such drive circuit enables the apparent brightness of all the LC devices constituting part of a display to be set independently of the digital input value that defines the brightness of each individual LC device, for example.

What is also needed is a drive circuit in which a P-bit digital input value defines the amplitude of the pure a.c. drive signal with a precision of one part in $2^B$, where $P<B$.

What is also needed is a drive circuit capable of generating an a.c. drive signal that includes a DC component having a level defined independently of the digital input value.

Drive circuits that can generate an a.c. drive signal whose RMS value is defined by a digital input value, and that may additionally include either or both a baseline a.c. component whose RMS value is defined independently of the digital input value and a DC component whose level is defined independently of the digital input value are needed for driving LC devices and for other applications.

SUMMARY OF THE INVENTION

The invention provides a differential drive circuit for generating a differential drive signal having a root mean square value defined by a digital input value. The differential drive signal includes a first differential component and a second differential component. The circuit comprises a first differential component generator and a second differential component generator. The first differential component generator is for counting a clock signal to generate successive values of a periodic count. Each of the values includes a most-significant bit. The first differential component generator is additionally for generating the first differential component in response to successive ones of the most-significant bit of the count. The second differential component generator is for generating the second differential component in response to the digital input value and the successive values of the count.

The first differential component generator may output the successive ones of the most-significant bit of the count as the first differential component.

The second differential component generator may include a digital phase shifter that operates in response to the digital input value and the count.

Either or both of the differential component generators may each include a synchronizing signal generator and a differential component waveform generator. The synchronizing signal generator generates a respective synchronizing signal that differs in phase from the differential component generated by the other of the differential component generators by a phase difference defined by the digital input value. The differential component waveform generator operates in response to the synchronizing signal to define the waveform of the respective differential component. The differential component waveform generator may define the waveform of the respective differential component in one or more of frequency, amplitude, average voltage, duty cycle and shape.

The invention additionally provides a method for generating a differential drive signal having a root mean square value defined by a digital input value. The differential drive signal includes a first differential component and a second differential component. In the method, a clock signal is provided, and is counted to generate successive values of a periodic count. The values each include a most-significant bit. The state of the first differential component is changed when the count reaches a predefined starting value, and the state of the second differential component is changed when the count has a predetermined relationship to the digital input value.

The method may additionally comprise generating a synchronizing signal corresponding to one of the differential components. The synchronizing signal differs in phase from the other of the differential components by a phase shift defined by the digital input value. The waveform of the one of the differential components is then defined in response to the synchronizing signal.

Finally, the invention provides a liquid crystal device that comprises a first electrode, a second electrode, a liquid crystal material sandwiched between the first electrode and the second electrode, a counter and a second differential component generator. The counter is connected to receive a clock signal and operates to count the clock signal to generate successive values of a periodic count. Each of the values includes a most-significant bit. The counter additionally operates to feed successive ones of the most-significant bit of the count to the first electrode as a first differential component. The second differential component generator is for receiving a digital input value and the successive values of the count, and is for generating a second differential component in response thereto, and is for feeding the second differential component to the second electrode.

The liquid crystal device may additionally comprise a plurality of second electrodes and a plurality of second differential component generators. Each of the plurality of second differential component generators is for receiving a respective digital input value and the successive values of the count, is for generating a respective second differential component in response thereto, and is for feeding the second differential component to the respective one of the second electrodes.

The liquid crystal device may additionally comprise an element that defines the waveform of at least one of the differential components.

DETAILED DESCRIPTION OF THE INVENTION

Figure 1:
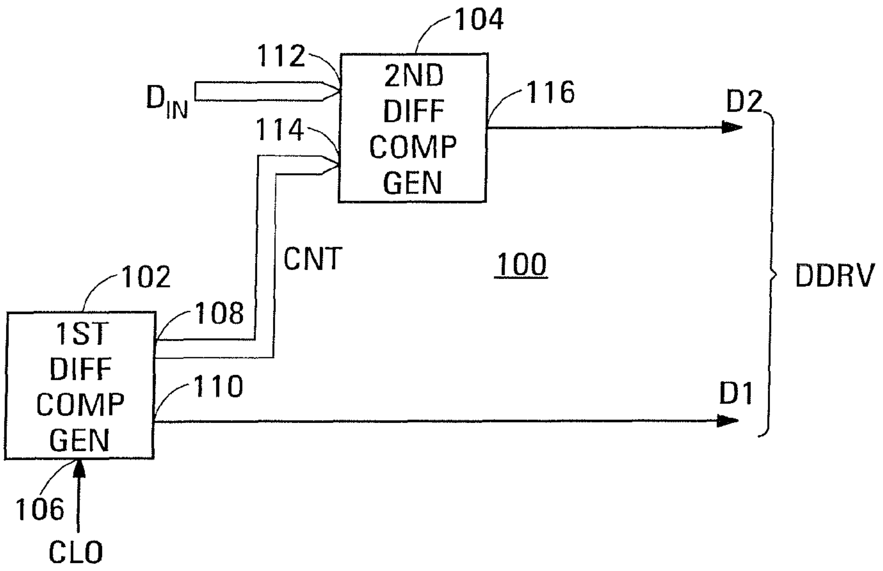
FIG. 1 is a block diagram of a first embodiment of a differential drive circuit according to the invention.

FIG. 1 is a block diagram of a first embodiment 100 of a differential drive circuit according to the invention. The differential drive circuit 100 receives the digital input value $D_{IN}$ and the clock signal CLO, and generates the first differential component D1 and the second differential component D2. The difference between the first differential component D1 and the second differential component D2 constitutes the differential drive signal DDRV. The differential drive signal is an a.c. signal having an RMS value defined by the digital input value.

The differential drive circuit 100 is composed of the first differential component generator 102 and the second differential component generator 104. The first differential component generator counts the clock signal CLO to generate successive values of the periodic count CNT. Each of the values includes a most-significant bit and less-significant bits. The first differential component generator generates the first differential component in response to successive ones of the most-significant bit of the count. The second differential component generator 104 receives the count CNT from the first differential component generator, and additionally receives the digital input value $D_{IN}$, and, in response to these inputs, generates the second differential component D2.

The first differential component generator 102 includes the clock input 106, the count output 108 and the first differential component output 110. The clock input is connected to receive the clock signal CLO. The first differential component generator counts the clock signal to generate the periodic count CNT, which it feeds to the count output. The first differential component generator additionally feeds successive ones of the most-significant bit of the count to the first differential component output 110 as the first differential component D1.

The second differential component generator 104 includes the count input 112, the digital input value input 114 and the second differential component output 116. The count input is connected to the count output 108 of the first differential component generator 102. The digital input value input is connected to receive the digital input value $D_{IN}$ that defines the RMS value of the differential drive signal DDRV. The second differential component generator generates the second differential component D2 and feeds the second differential component to the second differential component output 116.

Figure 2A:
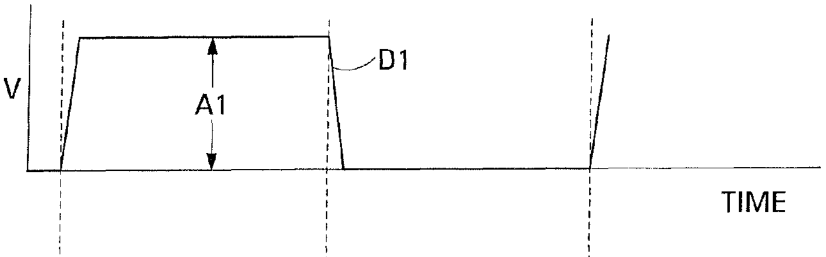
FIGS. 2A-2E are graphs illustrating the operation of the differential drive circuit shown in FIG. 1.

Operation of the differential drive circuit 100 will now be described with reference to FIGS. 2A-2E. FIG. 2A shows a portion of the first differential component D1 output by the first differential component generator 102. The first differential component is a square wave having an amplitude A1 and an average voltage of A1/2.

Figure 2B:
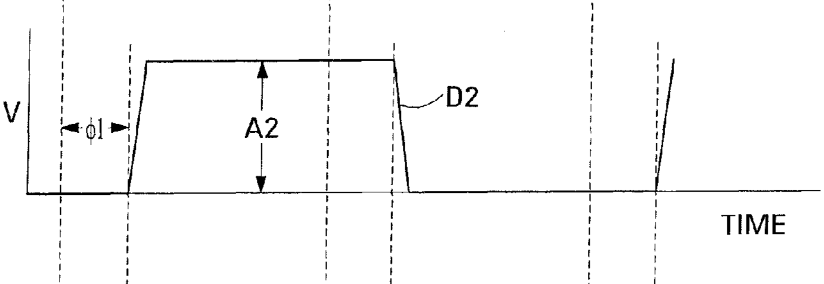

FIG. 2B shows a portion of a first example of the second differential component D2 output by the second differential component generator 104. The second differential component D2 is a square wave having the same frequency as the first differential component D1 and an amplitude A2 equal to the amplitude A1 of the first differential component D1 and an average voltage of A2/2 equal to that of the first differential component D1. The second differential component differs in phase from the first differential component by a phase difference $\phi_1$ defined by the digital input value $D_{IN}$. The phase difference between the first differential component and the second differential component determines the RMS value of the differential drive signal DDRV.

Figure 2C:
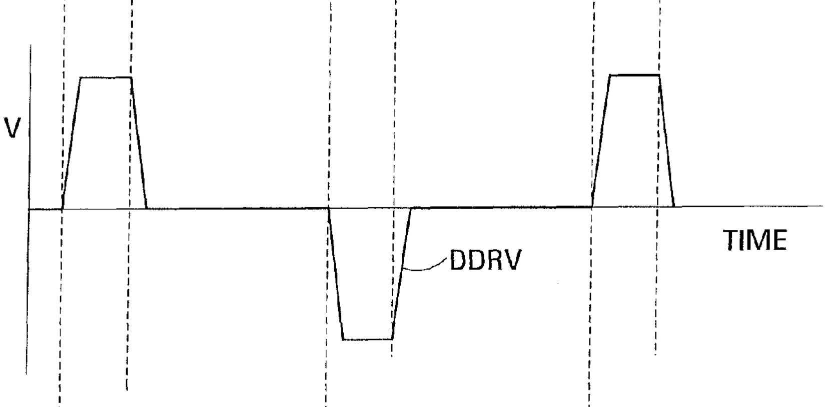

FIG. 2C shows the differential drive signal DDRV whose differential components are the first differential component D1 shown in FIG. 2A and the first example of the second differential component D2 shown in FIG. 2B. The phase difference between the first example of the second differential component shown in FIG. 2B and the first differential component is relatively small, so that the RMS value of the differential drive signal is also small. Also, the average voltage of the differential drive signal is zero, so the differential drive signal generated by the differential drive circuit 100 is a pure a.c. signal with no DC component.

Figure 2D:
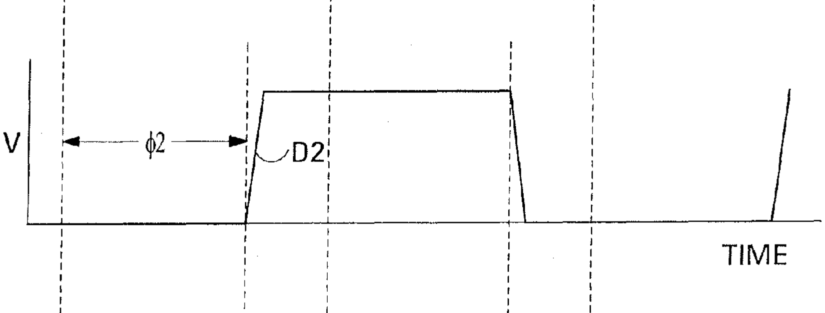

FIG. 2D shows a portion of a second example of the second differential component D2 output by the second differential component generator 104 in response to a digital input value larger than that in the first example shown in FIG. 2B. The second differential component D2 remains a square wave having the same frequency as the first differential component D1 and an amplitude A2 equal to the amplitude A1 of the first differential component D1. However, the phase difference 42 relative to the first differential component is larger than in the first example shown in FIG. 2B.

Figure 2E:
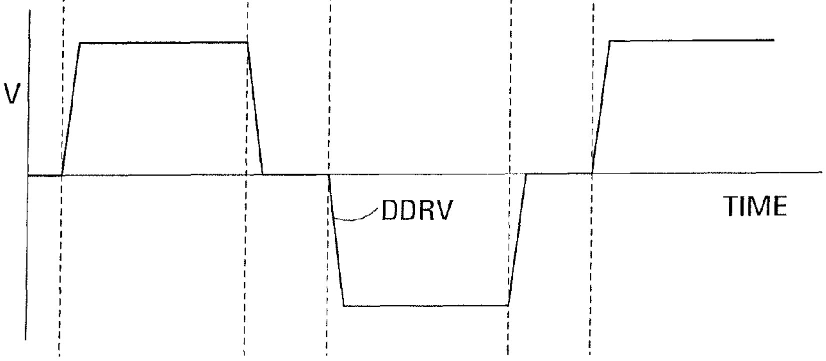

FIG. 2E shows the differential drive signal DDRV whose differential components are the first differential component D1 shown in FIG. 2A and the second example of the second differential component D2 shown in FIG. 2D. The increased phase difference between the first differential component and the second example of the second differential component shown in FIG. 2D results in the differential drive signal having a proportionally larger RMS value. However, the average voltage of the differential drive signal remains zero, so the differential drive signal remains a pure a.c. signal with no DC component.

Examples of counters suitable for use as or in the first differential component generator 102 will next be described with reference to FIGS. 3A-3D. Each of the counters may be used on its own as the first differential component generator 102 shown in FIG. 1. Alternatively, as will be described in more detail below, each of the counters may be used in the first differential component generator to generate a first synchronizing signal that is fed to a differential component waveform generator. The differential component waveform generator then generates the first differential component. Counters other those exemplified may also be suitable.

Figure 3A:
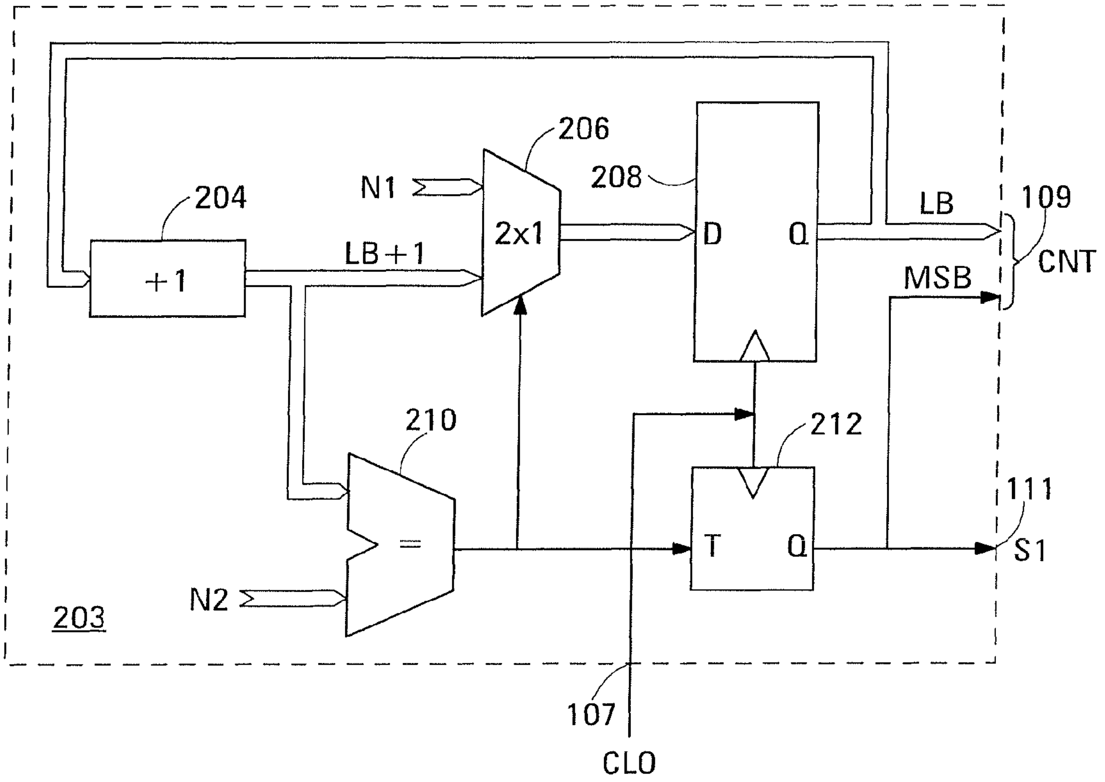
FIG. 3A is a block diagram of a first example of the first differential component generator of the differential drive circuit shown in FIG. 1.

Referring first to FIG. 3A, counters suitable for use as or in the first differential component generator 102 each include a clock input 107, a count output 109 and a first synchronizing signal output 111. The clock input 107 and the count output 109 are connected to the clock input 106 and the count output 108, respectively, of the first differential component generator. When the counter is used alone as the first differential component generator, the first synchronizing signal output 111 is connected to the first differential component output 110 of the first differential component generator, and the first synchronizing signal S1, composed of successive ones of the most-significant bit of the count, is output at the first differential component output as the first differential component D1.

FIG. 3A is a block diagram of a first example 203 of a counter that may be used as the first differential component generator 102 shown in FIG. 1. The counter 203 is configured to enable the lower and upper bounds of the count CNT to be set to arbitrary values, indicated by N1 and N2, where N2>N1+1. The lower and upper bounds correspond to the lower and upper bounds, respectively, of the range or the digital input value $D_{IN}$. The values of the upper and lower bounds may be provided to the first differential component generator by storing them in a suitable memory (not shown) connected to the counter, by hard-wiring them to the inputs of the counter that receive them, or in some other suitable way.

The counter 203 receives the clock signal CLO at the clock input 107. In response to the clock signal, the counter counts from the lower bound N1 to the upper bound N2 to generate successive values of the count CNT and outputs the successive value of the count at the count output 109. The counter additionally outputs successive ones of the most-significant bit of the count at the first synchronizing signal output 111 as the first synchronizing signal S1.

The counter 203 is composed of the incrementer 204, the multiplexer 206, the register 208, the comparator 210 and the flip-flop 212.

The incrementer 204 is a combinatorial incrementer and includes a data input and a data output.

The multiplexer 206 is a 2×1 multiplexer, and includes a first data input, a second data input, a control input and a data output. The first data input is connected to receive a digital input that defines the lower limit N1 of the count, the second data input is connected to the data output of the incrementer 204.

The register 208 includes the data input D, the data output Q and a clock input. The data input is connected to the data output of the multiplexer 206. The data output is connected to the input of the incrementer 204 and additionally to the count output 109 to which it provides the less-significant bits LB of the count CNT. The clock input is connected to the clock input 107.

The comparator 210 is a combinational equality comparator and includes a first data input, a second data input and a comparison output. The first data input is connected to the data output of the incrementer 204. The second data input is connected to receive a digital input that defines the upper limit N2 of the count. The comparison output is connected to the control input of the multiplexer 206.

The flip-flop 212 is a toggle flip flop and includes the toggle input T, a clock input and the data output Q. The toggle input is connected to the comparison output of the comparator 210, the clock input is connected to the clock input 107, and the data output is connected to the first synchronizing signal output 111. The data output Q of the flip-flop is additionally connected to the count output 109 to provide the most-significant bit MSB of the count.

The counter 203 operates as follows. The current state of the less-significant bits LB of the count CNT is held in the register 208. The register feeds the value of the less-significant bits to the incrementer 204. The incrementer computes the next value LB+1 of the less-significant bits and feeds this value to the first data input of the multiplexer 206 and the first data input of the comparator 210.

The comparator 210 compares the next value LB+1 of the less-significant bits to the digital input that defines the upper bound N2 of the counter. The state of the comparison output of the comparator is normally 0, and changes to 1 when LB+1=N2.

The state of the comparison output of the comparator 210, when fed to the multiplexer 206, determines whether the multiplexer feeds the next value LB+1 of the less-significant bits or the digital input that defines the lower bound N1 into the register 208 on the next cycle of the clock signal CLO. When the state of the comparison output is 0, the multiplexer feeds the next value LB+1 of the less-significant bits into the register. As a result, the less-significant bits LB cycle through the values N1, N1+1, N1+2, . . . N2−1, etc., changing at every clock cycle.

When the next value LB+1 of the less-significant bits of the count is equal to the digital input that defines the upper bound N2, the state of the comparison output of the comparator 210 changes. The changed state of the comparison output of the comparator toggles the flip-flop 212 and causes the multiplexer 206 to reset the contents of the register 208 to the lower bound N1. The flip-flop 212 generates the first synchronizing signal S1 and additionally provides the most-significant bit of the count CNT.

When the state of the comparison output of the comparator 210 is 0, the state of the first synchronizing signal S1 output by the flip-flop 212 remains unchanged. When the state of the comparison output changes to 1 in response to the next value LB+1 of the less-significant bits being equal to the digital input that defines the upper bound N2, the data output Q of the flip-flop toggles to the opposite state. As a result, the first synchronizing signal changes state and remains in this state until the next time the state of the comparison output changes from 0 to 1. Thus, the first synchronizing signal output by the data output Q of the flip-flop changes state each time the lower bound N1 is loaded into the register 208 to reset the counter 203 to its starting value N1.

The circuit of the counter 203 can be simplified for specific values of N1 or N2. When N1 is zero, a register with a synchronous reset can be used as the register 208 and the multiplexer 206 can be omitted.

In a counter that counts from N1 to $2^B$, i.e., N2=$2^B$, where B is the number of bits of the incrementer 204, and the incrementer includes a carry output, the comparator 210 can be omitted, and the carry output of the incrementer can be used to control the multiplexer 206 and the flip-flop 212.

Figure 3B:
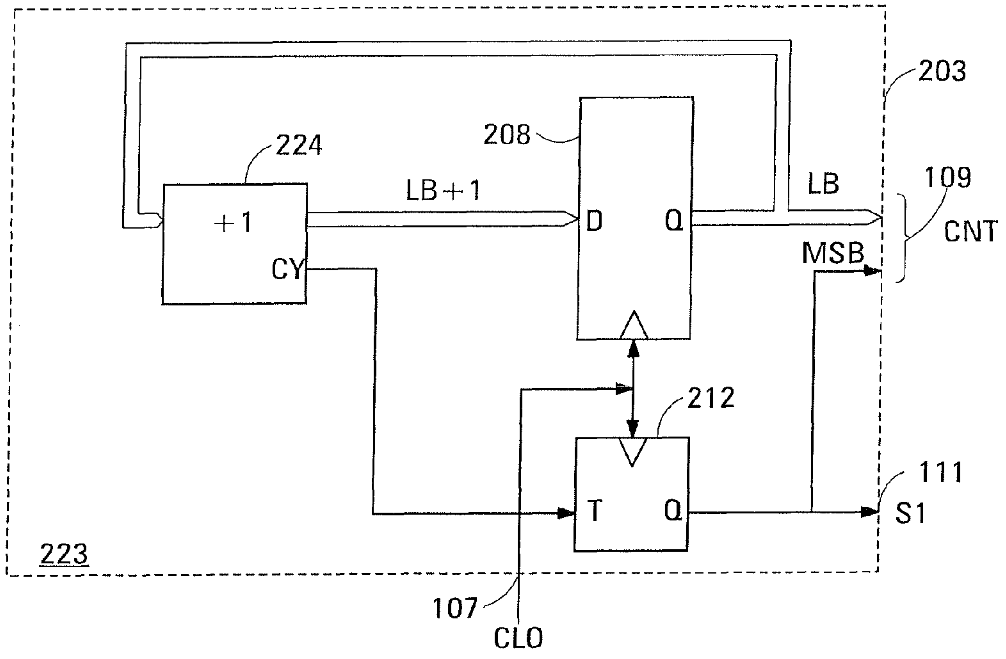
FIG. 3B is a block diagram of an embodiment of the first differential component generator shown in FIG. 3A that counts from zero to $(2^B-1)$.

FIG. 3B is a block diagram of an embodiment 223 of the counter 203 that counts from zero to ($2^B$−1). Elements of the counter 223 that correspond to elements of the counter 203 shown in FIG. 3A are indicated by the same reference numerals and will not be described again here.

In the counter 223, the incrementer 224 is a combinatorial incrementer that includes a data input, a data output and the carry output CY. The data output and data input are connected to the data input and data output, respectively, of the register 208. The carry output CY is connected to the input T of the toggle flip-flop 212.

Normally, the state of the carry output CY of the incrementer 224 is 0. The incrementer feeds successive values of the next value LB+1 of the less-significant bits of the count to the data input of the register 208. Each time the next value LB+1 tries to reach $2^B$, the next value rolls over to zero and the state of the carry output changes to 1 for 1 cycle of the clock signal CLO. Successive changes in the state of the carry output toggle the output Q of the flip-flop 212 and, hence, the state of the first synchronizing signal S1. The data output of the incrementer rolling over to zero additionally resets the count CNT generated by the counter 223 to zero.

Figure 3C:
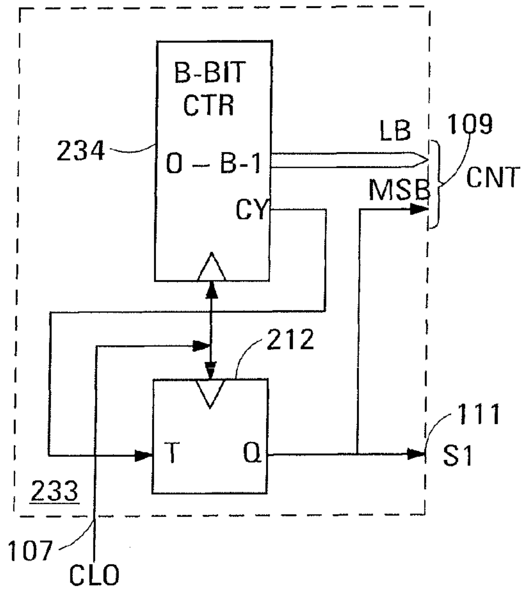
FIG. 3C is a block diagram of a second example of the first differential component generator that includes a B-bit counter with a carry output.
Figure 3D:
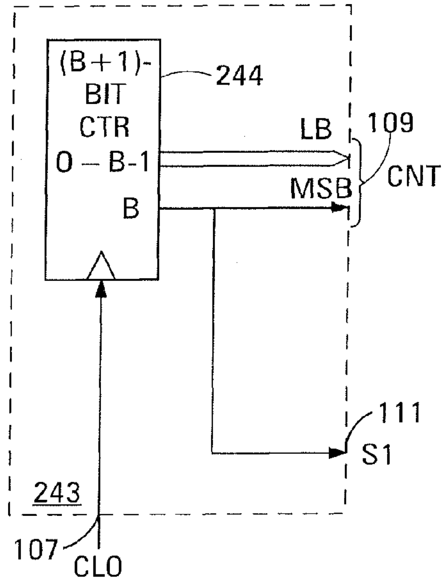
FIG. 3D is a block diagram of a third example of the first differential component generator that includes a (B+1)-bit counter.

When the lower and upper bounds of the digital input value are 0 and ($2^B$−1), a conventional B-bit or (B+1)-bit counter can be used as the counter 101, as illustrated in FIGS. 3C and 3D, respectively.

FIG. 3C is a block diagram of a second example 233 of a counter suitable for use as or in the first differential component generator 102. The counter 233 includes a B-bit counter with a carry output. Elements of the counter 233 that correspond to elements of the counter 203 shown in FIG. 3A are indicated by the same reference numerals and will not be described again here.

The counter 233 is composed of the B-bit counter 234 and the toggle flip-flop 212. The B-bit counter 234 includes a clock input, a B-bit data output and the carry output CY. The clock input is connected to receive the clock signal CLO. The data output is connected to the count output 109, where it provides the B less-significant bits of the count CNT.

The flip-flop 212 is described above. The flip flop has a clock input, a toggle input T and a data output Q. The clock input is connected to receive the clock signal CLO. The toggle input T is connected to the carry output CY of the B-bit counter 234. The data output Q is connected to the first synchronizing signal output 111. The data output Q of the flip-flop is additionally connected to the count output 109 where it provides the most-significant bit MSB of the count CNT.

The B-bit counter 234 counts the clock signal CLO to provide successive values of the less-significant bits LB of the count. Each time the next value LB+1 of the less-significant bits tries to reach $2^B$, the next value rolls over to zero and the state of the carry output CY changes to 1 for one cycle of the clock signal CLO. Successive changes in the state of the carry output toggle the output Q of the flip-flop 212, and, hence, the most-significant bit MSB of the count and the state of the first synchronizing signal S1.

FIG. 3D is a block diagram of a third example 243 of a counter suitable for use as or in the first differential component generator 102. The counter 243 includes a (B+1)-bit counter. Elements of the counter 243 that correspond to elements of the counter 203 shown in FIG. 3A are indicated by the same reference numerals and will not be described again here.

The counter 243 is composed of the (B+1)-bit counter 244, which includes a clock input and a (B+1)-bit data output. The clock input is connected to the clock input 107 to receive the clock signal CLO. Bits 0 to (B−1) of the data output are connected to the count output 109, where they provide the B less-significant bits of the count CNT. Bit B of the data output is connected to the count output where it provides the most-significant bit of the count. Bit B of the data output is additionally fed to the first synchronizing signal output 111, where it provides the first synchronizing signal.

The (B+1)-bit counter 244 counts the clock signal CLO. Bits 0 to (B−1) of the data output provide successive values of the less-significant bits LB of the count CNT. Each time the next value LB+1 of the less-significant bits tries to reach $2^B$, the most-significant bit B changes state. The most-significant bit remains in its changed state until the next time the next value LB+1 of the less-significant bits tries to reach $2^B$, which causes the most-significant bit B to revert to its original state.

The counter that forms at least part of the first differential component generator 102 may be a binary counter, in which case, the digital input value $D_{IN}$ fed to the second differential component generator 104 is a binary value. Alternatively, unwanted mid-cycle changes of state in the count CNT and in the first synchronizing signal output by the counter may be avoided by using a Gray code counter. In this case, the digital input value $D_{IN}$ is a Gray code value.

Examples of digital phase shifters suitable for use as or in the second differential component generator 104 will next be described with reference to FIGS. 4A and 4B. Each of the digital phase shifters may be used on its own as the second differential component generator 104 shown in FIG. 1. Alternatively, as will be described in more detail below, each of the digital phase shifters may be used to generate a second synchronizing signal that is fed to a second differential component waveform generator that generates the second differential component. Digital phase shifter circuits other those exemplified may also be suitable.

The digital phase shifter generates the second synchronizing signal S2 in response to the digital input value $D_{IN}$ and the count CNT. The second synchronizing signal is a square wave differing in phase relative to the first differential component D1 by a phase difference defined by the digital input value $D_{IN}$. In embodiments in which the digital phase shifter is used on its own as the second differential component generator, the second synchronizing signal provides the second differential component. In this case, the digital phase shifter generates the second differential component to have the same amplitude as the first differential component.

Digital phase shifters suitable for use as or in the second differential component generator 104 each include a digital input value input 113, a count input 115 and a second synchronizing signal output 117. The digital input value input and the count input are connected to the digital input value input 112 and the count input 114, respectively, of the second differential component generator. Additionally, when the digital phase shifter is used alone as the second differential component generator, the second synchronizing signal output 117 is connected to the second differential component output 116 of the second differential component generator.

Figure 4A:
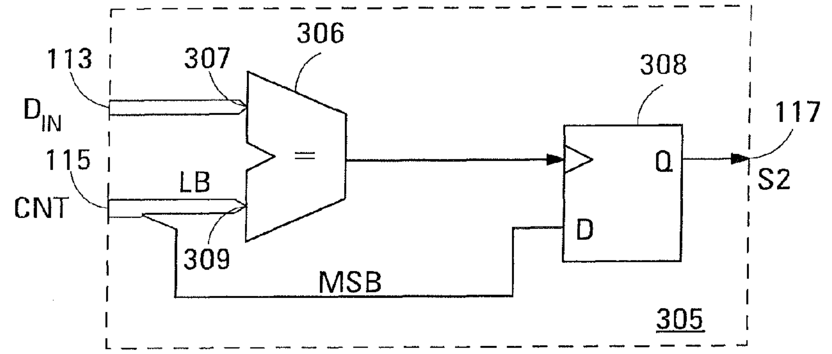
FIG. 4A is a block diagram of a first example of the digital phase shifter included in the second differential component generator of the differential drive circuit shown in FIG. 1.

FIG. 4A is a block diagram of a first example 305 of a digital phase shifter suitable for use in or as the second differential component generator 104 shown in FIG. 1. In this embodiment, the successive values of the count have a word length one greater than the word length of the digital input value $D_{IN}$.

The digital phase shifter 305 is composed of the comparator 306 and the D-type flip-flop 308. The comparator 306 is a combinational equality comparator and includes the data inputs 307 and 309 and an output. The data input 307 is connected to the digital input value input 113. Embodiments of the digital phase shifter for use in applications in which the digital input value $D_{IN}$ is ephemeral may additionally include a memory for storing the digital input value $D_{IN}$. Such memory is interposed between the digital input value input 113 and the data input 307. Alternatively, the data input 307 may incorporate such memory. The data input 309 is connected to the count input 115 to receive only the less-significant bits LB of the count CNT.

The flip-flop 308 is a D-type flip-flop and includes the data input D, a clock input and the data output Q. The data input is connected to the count input 115 to receive successive ones of the most-significant bit MSB of the count CNT, the clock input is connected to the output of the comparator 306, and the data output Q is connected to the second synchronizing signal output 117.

The digital phase shifter 305 operates as follows. Successive values of the count CNT output by the first differential component generator 102 increment, beginning at the lower bound N1 (e.g., 0). During the first half-cycle of the count (and subsequent odd half-cycles), the most-significant bit MSB of the count is in its 0 state. The comparator 306 receives the digital input value $D_{IN}$ at the data input 307 and receives the less-significant bits LB of successive values of the count CNT at the data input 309. The lower and upper bounds of the less-significant bits LB of the count are the same as the lower and upper bounds, respectively, of the range of the digital input value $D_{IN}$. Initially, the less-significant bits LB of the successive values the count differ from the digital input value. Consequently, the output of the comparator is in its 0 state.

Eventually, the less-significant bits LB of the count will equal the digital input value $D_{IN}$, and the state of the output of the comparator will change to 1. The change of state of the output of the comparator received at the clock input of the flip-flop 308 causes the flip-flop to sample the current state of the most-significant bit MSB of the count CNT, received at the data input D. The flip-flop outputs the current state of the MSB of the count at the data output Q. Thus, since the state of the MSB of the count is 0, the state of the second synchronizing signal S2 changes to 0. The state of the second synchronizing signal changes to be the same as that as the MSB of the count after a time determined by the time required for the less-significant bits of the count to increment to a value equal to the digital input value $D_{IN}$.

On the next cycle of the clock CLO, the less-significant bits LB of the count CNT become different from the digital input value $D_{IN}$, and the output of the comparator 306 returns to its 0 state. However, the resulting negative-going transition applied to the clock input of the flip-flop 308 does not change the state of the second synchronizing signal S2.

The count CNT eventually reaches its upper bound N2 and resets to its lower bound N1. Successive values of the count CNT output by the counter increment, beginning at the lower bound. During the second half-cycle (and subsequent even half-cycles) of the count, the most-significant bit MSB of the count is in its 1 state. The process described above repeats, and the state of the output of the comparator 306 changes to 1 when the less-significant bits LB of the count again equal the digital input value $D_{IN}$. The change of state of the output of the comparator clocks the current state of the most-significant bit MSB of the count CNT, received at the data input D of the flip-flop 308, from the data input D to the data output Q. Since the state of the MSB is now 1, the state of the second synchronizing signal changes to 1. The state of the second synchronizing signal changes to be the same as that of the MSB after a time determined by the time required for the less-significant bits LB of the count to increment to a value equal to the digital input value $D_{IN}$.

The process described above repeats. The point at which the second synchronizing signal changes state changes when a new value of the digital input value $D_{IN}$ is received at the digital input value input 112.

Figure 4B:
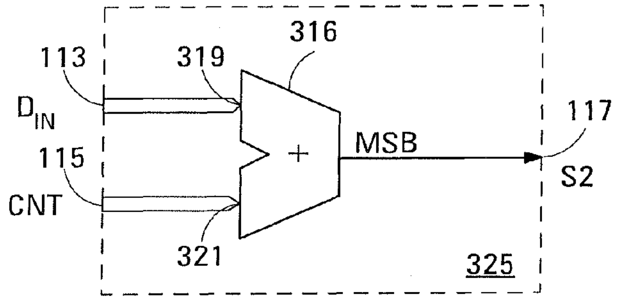
FIG. 4B is a block diagram of a second example of the digital phase shifter included in the second differential component generator of the differential drive circuit shown in FIG. 1.

FIG. 4B is a block diagram of a second example 325 of a digital phase shifter suitable for use in or as the second differential component generator 104 shown in FIG. 1. The digital phase shifter 325 generates the second synchronizing signal S2 in response to the digital input value $D_{IN}$ and the count CNT. In this embodiment, the successive values of the count have a word length equal to the word length of the digital input value $D_{IN}$.

The digital phase shifter 325 is composed of the binary adder 316. The binary adder is a B-bit adder, where B is the full number of bits constituting each value of the count CNT and the number of bits constituting the digital input value $D_{IN}$.

The binary adder 316 includes the data inputs 319 and 321 and a sum output, of which only the most-significant bit MSB is used. The most-significant bit of the sum output is connected to the second synchronizing signal output 117. The data input 319 is connected to the digital input value input 113. The data input 321 is connected to the count input 115. Embodiments of the second differential component generator 325 for use in applications in which the digital input value $D_{IN}$ is ephemeral may additionally include a memory for storing the digital input value $D_{IN}$. Such memory is interposed between the digital input value input 113 and the data input 319. Alternatively, the data input 319 may incorporate such memory.

The digital phase shifter 325 operates as follows. The binary adder 316 receives the digital input value $D_{IN}$ at the data input 319 and the successive values of the count CNT output by the first differential component generator 102 at the data input 321. The binary adder sums the digital input value and each value of the count to generate a respective sum. Successive values of the count increment, beginning at the lower bound N1 (e.g., 0). At least the first value of the count is such that the sum of this value and the digital input value has a most-significant bit of 0.

Eventually, the count reaches a value that causes the most-significant bit of the sum generated by the binary adder 316 to change to its 1 state. The most-significant bit of the sum remains in its 1 state for further successive values of the count until the value of the count causes the binary adder to overflow. When this occurs, the most-significant bit of the sum reverts to 0. The most-significant bit stays in its 0 state for the remainder of the count cycle.

The most-significant bit of the sum generated by the binary adder 316 stays in each of its 0 and 1 states for an equal number of values of the count. Hence, the waveform of the most-significant bit is a square wave. The point in the count CNT at which the most-significant bit of the sum output changes state depends on the digital input value $D_{IN}$. Thus, the second synchronizing signal differs in phase from the most-significant bit of the count by a phase difference defined by the digital input value.

Figure 5:
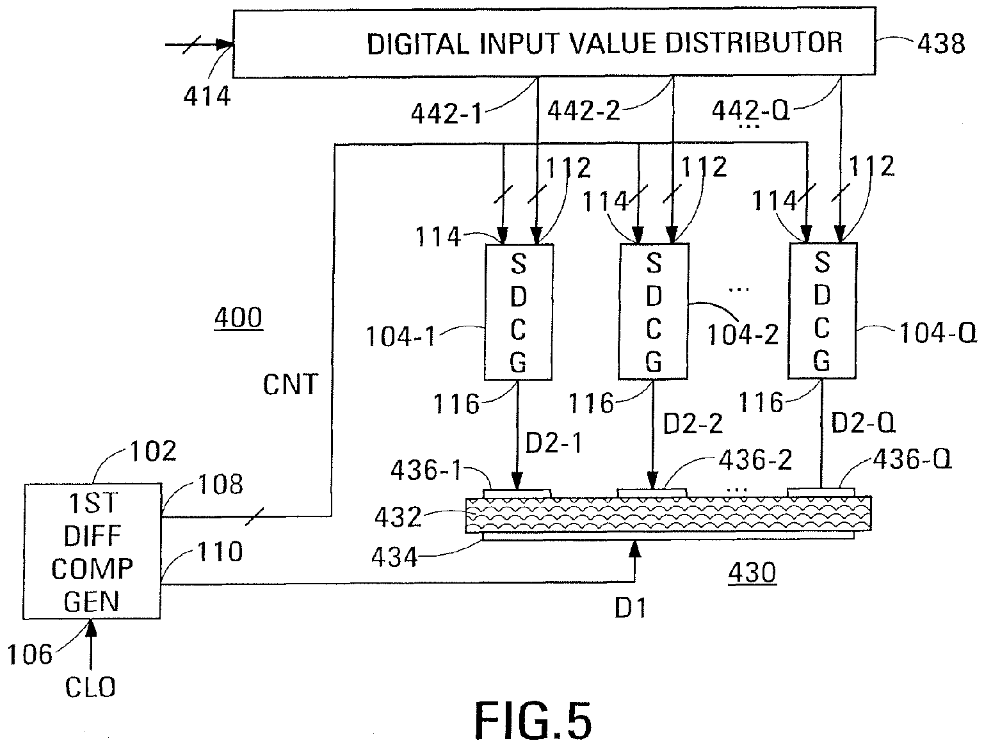
FIG. 5 is a block diagram of a liquid crystal device according to the invention that includes a second embodiment of a differential drive circuit according to the invention.

FIG. 5 shows a liquid crystal device 430 according to the invention. The liquid crystal device includes a second embodiment 400 of a differential drive circuit according to the invention. The liquid crystal device may constitute part of a liquid crystal display, for example. The liquid crystal device is composed of a layer 432 of liquid crystal material sandwiched between the common electrode 434 and an array of cell electrodes 436-1 to 436-Q. The number of cell electrodes typically ranges from less than 10 to over 1 million. The cell electrodes are arranged in a one- or two-dimensional array. Only the cell electrodes 436-1, 436-2, . . . , 436-Q constituting part of one dimension of the array are shown in FIG. 5 to simplify the drawing. Each of the cell electrodes defines a liquid crystal cell whose optical characteristics are defined by the RMS value of the differential drive signal applied by the corresponding element of the differential drive circuit 400 between the respective cell electrode and the common electrode.

The differential drive circuit 400 is composed of the first differential component generator 102 and the second differential component generators 104-1, 104-2, . . . 104-Q. The first differential component output 110 of the counter is connected to the common electrode 434. The count output 108 is connected to the count input 114 of each of the second differential component generators so that second differential component generators receive the count in parallel. The second differential component output 116 of each of the second differential component generators 104-1, 104-2, . . . , 104-Q is connected to the respective cell electrode 436-1, 436-2, . . . , 436-Q.

The differential drive circuit 400 additionally includes the digital input value distributor 438. The digital input value distributor includes the digital input value input 414 and the digital input value outputs 442-1, 442-2, . . . , 442-Q. The digital input value distributor receives via the digital input value input 414 the digital input values $D_{IN}$ to be distributed to the second differential component generators 104-1, 104-2, . . . , 104-Q. Each of the digital input value outputs 442-1, 442-2, . . . , 442-Q is connected to the digital input value input 112 of a respective one of the second differential component generators 104-1, 104-2, . . . , 104-Q. The digital input value outputs of the digital input value distributor may alternatively be connected to the digital input value inputs of all the second differential component generators located in a column arranged orthogonally to the row of second differential component generators shown.

In embodiments in which the digital input value distributor 438 ephemerally distributes the digital input values to the second differential component generators 104-1, 104-2, . . . , 104-Q, the second differential component generators additionally include a memory (not shown) that stores the digital input value received from the digital input value distributor. Ephemeral distribution typically occurs when the digital input value distributor provides digital input values to multiple rows (or columns) of second differential component generators, as described above.

The second differential component generators 104-1, 104-2, . . . , 104-Q each operate in response to the digital input value received from the digital input value distributor 438 and in response to the count CNT received from the first differential component generator 102 to generate a respective second differential component that is applied to the respective one of the cell electrodes 436-1, 436-2, . . . , 436-Q. The phase difference between the first differential component and the second differential component D2 generated by each of the second differential component generators 104-1, 104-2, . . . , 104-Q, and, hence the RMS value of the differential drive signal DDRV applied to the respective cell electrode and the common electrode, depends on the digital input value received by the second differential component generator from the digital input value distributor.

In the above-described differential drive circuits 100 and 400, a counter, such as one of the counters shown in FIGS. 3A-3D, may constitute the entire first differential component generator 102 and a digital phase shifter, such as one of the digital phase shifters shown in FIGS. 4A and 4B, may constitute the entire second differential component generator 104. In this case, the first synchronizing signal S1 generated by the counter is output as the first differential component D1, and the second synchronizing signal generated by the digital phase shifter is output as the second differential component D2. Alternatively, either or both of the first differential component generator and the second differential component generator may include a differential component waveform generator that operates in response to the respective synchronizing signal to define the waveform of the respective differential component.

Many applications need the differential drive circuit to generate the differential drive signal DDRV as a pure a.c. signal having an RMS value defined exclusively by the digital input value $D_{IN}$ and including no DC component. Such a differential drive signal is generated when the first differential component generator 102 and the second differential component generator 104 generate the differential components D1 and D2 with equal frequencies, amplitudes, average voltages and duty cycles, and with the same waveform shape. When a counter constitutes the first differential component generator and a digital phase shifter constitutes the second differential component generator, as described above, the counter and digital phase shifter generate the differential components as square waves with equal frequencies, equal duty cycles and the same waveform. They additionally generate the differential components with equal amplitudes when at least their output stages have the same or a similar circuit configuration and are operated on a common power supply, or on power supplies that generate an equal output voltage.

Some applications need the differential drive circuit to generate the differential components with their amplitudes defined independently of the outputs of the counter and the digital phase shifter. Additionally or alternatively, some applications need the differential drive circuit to generate the differential drive signal with a non-square waveform. A non-square waveform typically has a lower level of high harmonics than a square waveform. Additionally or alternatively, some applications need the differential drive circuit to generate the differential drive signal to include a baseline a.c. component having an RMS value defined independently of the digital input value and additionally or alternatively to include a DC component. An embodiment of a differential drive circuit according to the invention that can be configured to generate the differential drive signal with any one or more of the above-described characteristics will be described next.

Figure 6:
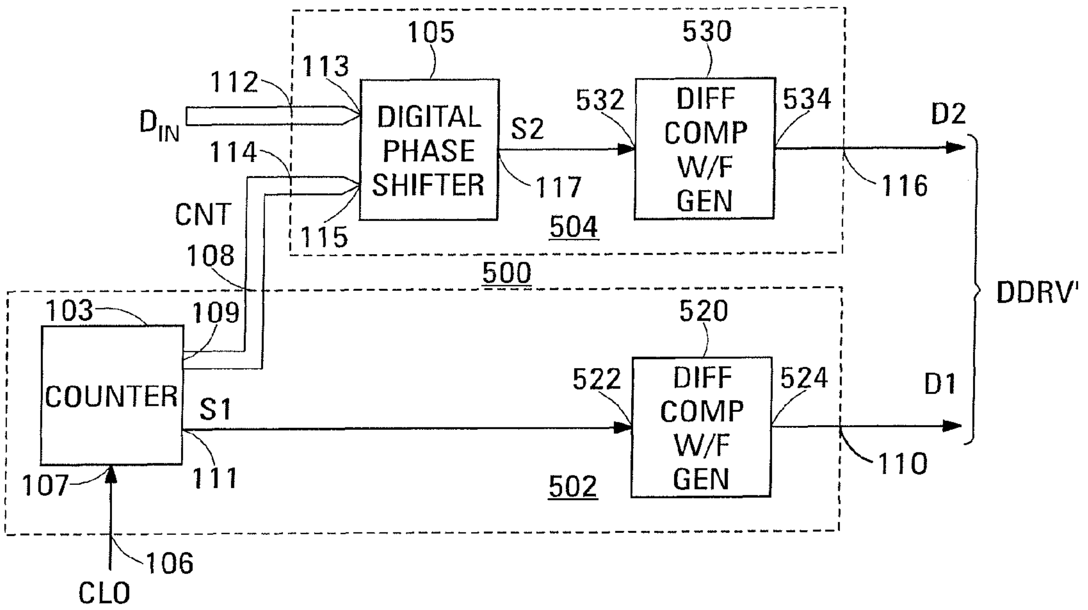
FIG. 6 is a block diagram of a third embodiment of a differential drive circuit according to the invention.

FIG. 6 is a block diagram of a third embodiment 600 of a differential drive circuit according to the invention in which the first differential component generator and the second differential component generator each include a differential component waveform generator. The differential component waveform generator operates in response to the respective synchronizing signal to define the waveform of the respective differential component. The differential drive circuit 600 is based on the differential drive circuit 100 described above with reference to FIG. 1. It will be apparent to a person of ordinary skill in the art that a differential drive circuit corresponding to the differential drive circuit 600 can alternatively be based on the differential drive circuit 400 described above with reference to FIG. 5. Elements of the differential drive circuit 500 that correspond to elements of the differential drive circuits described above with reference to FIGS. 1 and 5, the counters described above with reference to FIGS. 3A-3D and the digital phase shifters described above with reference to FIGS. 4A and 4B are indicated using the same reference numerals and will not be described again here.

In the differential drive circuit 500, the first differential component generator 502 is composed of the counter 103 and the differential component waveform generator 520, and the second differential component generator 504 is composed of the digital phase shifter 105 and the differential component waveform generator 530. Any of the counters described above with reference to FIGS. 3A-3D, or another suitable counter, may be used as the counter 103. The clock input 107 and the count output 109 of the counter are connected to the clock input 106 and the count output 108, respectively, of the first differential component generator 502. Any of the digital phase shifters described above with reference to FIGS. 4A and 4B, or another suitable digital phase shifter, may be used as the digital phase shifter 105. The digital input value input 113 and the count input 115 of the digital phase shifter are connected to the digital input value input 112 and the count input 114 of the second differential component generator 504.

The differential component waveform generator 520 includes the synchronizing signal input 522 and the first differential component output 524. The synchronizing signal input 522 is connected to the first synchronizing signal output 111 of the counter 103. The differential component output 524 is connected to the first differential component output 110 of the first differential component generator 502 and provides the first differential component D1.

The differential component waveform generator 530 includes the synchronizing signal input 532 and the second differential component output 534. The synchronizing signal input 532 is connected to the second synchronizing signal output 117 of the digital phase shifter 105. The second differential component output 534 is connected to the second differential component output 116 of the second differential component generator 504 and provides the second differential component D2.

The differential component waveform generator 520 operates in response to the first synchronizing signal S1 generated by the counter 103 to define the waveform of the first differential component D1. The differential component waveform generator 530 operates in response to the second synchronizing signal S2 generated by the digital phase shifter 105 to define the waveform of the second differential component D2.

The differential component waveform generators 520 and 530 may each define any property of the waveform of the respective differential component other than its phase difference from the other differential component. The phase difference is defined by the digital input value $D_{IN}$, as described above. The differential component waveform generator may define such properties of the waveform of the respective differential component as frequency, amplitude, average voltage, duty cycle and shape.

The differential component waveform generators 520 and 530 may each define the shape of the waveform of the respective differential component as a square waveform with a defined frequency, amplitude, duty cycle, average voltage and shape. Alternatively, the differential component waveform generators 520 and 530 may each define the shape of the waveform of the respective differential component as a non-square waveform, such as a triangular, sinusoidal, sawtooth or trapezoidal waveform. Circuits for generating signals with non-square waveforms and that are synchronized to a synchronizing signal are known in the art. Examples of such circuits will therefore not be described here.

The differential component waveform generators 520 and 530 typically define the waveforms of the first differential component D1 and the second differential component D2 as waveforms having the same frequency. However, this is not critical to the invention. The differential components may differ in frequency.

In many applications, the differential component waveform generators 520 and 530 define the waveforms of the differential components D1 and D2 to have equal frequencies, equal amplitudes, equal average voltages, equal duty cycles and the same shape. In this case, the differential drive signal is a pure a.c. signal whose amplitude is defined by the digital input value.

Some applications need the differential drive circuit to generate the differential drive signal to include a baseline a.c. component having an RMS value independent of the digital input value $D_{IN}$. For example, generating the differential drive signals applied to the cell electrodes 436-1, 436-2, . . . , 436-Q of the liquid crystal device 430 shown in FIG. 5 each to include a baseline a.c. component whose RMS value is defined independently of the digital input values supplied to the respective second differential component generators 104-1, 104-2, . . . , 104-Q provides control over black level when the liquid crystal device forms part of a display. As will be described below, the differential component waveform generators 520 and 530 may each define the waveforms of the differential components to have amplitudes that differ symmetrically from one another. A symmetrical amplitude difference causes the differential drive signal to include a baseline a.c. component whose RMS value is defined independently of the digital input value $D_{IN}$.

Some applications need the differential drive circuit to generate the differential drive signal to include a DC component. For example, in an embodiment of the liquid crystal device 430 shown in FIG. 5 in which an electrochemical potential difference exists between the material of the electrodes and the liquid crystal material, a pure a.c. differential drive signal applied between the electrodes will apply to the liquid crystal material a differential drive signal that includes an undesirable DC component. The DC component is the result of the electrochemical potential difference. Driving the electrodes with an a.c. differential drive signal that includes a DC component equal and opposite to the electrochemical potential difference will enable the electrodes to apply a pure a.c. differential drive signal to the liquid crystal material. As will be described below, the differential component waveform generators 520 and 530 may each define the waveforms of the differential components to have amplitudes that differ asymmetrically from one another, or to differ in duty cycle. An asymmetrical amplitude difference or a duty cycle difference, each of which causes the differential components to differ in average voltage, causes the differential drive signal to include a DC component whose level is defined independently of the digital input value.

Finally, as will be described below, the differential component waveform generators 520 and 530 may each be configured to define the waveforms of the differential components to differ from one another with symmetrical and asymmetrical components. A waveform difference that includes symmetrical and asymmetrical components causes the differential drive signal to include both a baseline a.c. component whose RMS value is defined independently of the digital input value $D_{IN}$ and a DC component.

Exemplary embodiments of the differential component waveform generator 520 of the differential drive circuit 500 shown in FIG. 6 will now be described with reference to FIGS. 6 and 7A-7D. Each of the embodiments of the differential component waveform generator to be described with reference to FIGS. 7A-7D may be used as both of the differential component waveform generators 520 and 530. Alternatively, one of the embodiments may be used as the differential component waveform generator 520 and another of the embodiments may be used as the differential component waveform generator 530. As a further alternative, only one of the differential component generators 502 and 504 may include one of the embodiments of the differential component waveform generator, and the other differential component generator may output the respective synchronizing signal as the respective differential component, as described above.

Figure 7A:
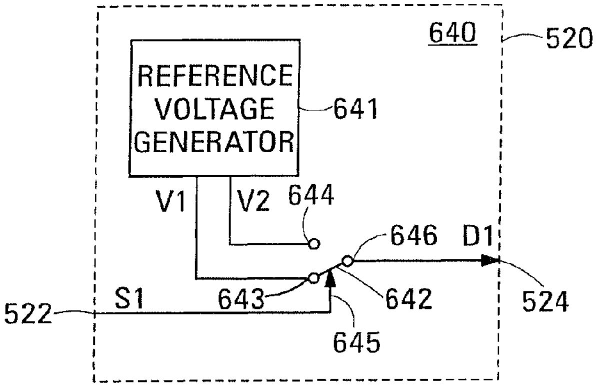
FIG. 7A is a block diagram of a first exemplary embodiment of the differential component waveform generator of the differential drive circuit according to the invention shown in FIG. 6.

FIG. 7A is a block diagram showing a first exemplary embodiment 640 of the differential component waveform generator 520. The differential component waveform generator 640 generates the first differential component with a defined amplitude and average voltage. Elements of the differential component waveform generator 640 shown in FIG. 7A that correspond to elements of the differential component waveform generator described above with reference to FIG. 6 are indicated using the same reference numerals and will not be described again here.

The differential component waveform generator 640 is composed of the reference voltage generator 641 and the switch 642. The switch is a controlled change-over switch. The reference voltage generator 641 generates the reference voltages V1 and V2. The outputs of the reference voltage generator that provide the reference voltages V1 and V2 are respectively connected to the inputs 643 and 644 of the switch. The control input 645 of the switch is connected to the synchronizing signal input 522. The output 646 of the switch is connected to the first differential component output 524. In response to the first synchronizing signal S1, the switch alternates between the reference voltage V1 and the reference voltage V2 to generate the first differential component D1.

In an embodiment of the differential drive circuit 500 shown in FIG. 6 in which the first differential component generator 502 includes the differential component waveform generator 640 and the second differential component D2 alternates between a reference voltage V3 and a reference voltage V4, the RMS value of the baseline a.c. component of the differential drive signal DDRV is given by:

$$||V2-V1|-|V4-V3||/2,$$

the maximum RMS value of the differential drive signal DDRV is given by:

$$||V2-V1|+|V4-V3||/2, \text{ and}$$

the DC component of the differential drive signal is given by:

$$|(V1+V2)/2-(V3+V4)/2|,$$

where |x| is the absolute value of x.

The RMS value of the baseline a.c. component of the differential drive signal is zero when |V4−V3|=|V2−V1|, i.e., when the differential components are equal in amplitude, as described above. In particular, the RMS value of the baseline a.c. component is zero when V1=V3=0 and V2=V4, or V2=V4=0 and V1=V3. These conditions apply, for example, in the examples described above in which the first differential component generator and the second differential component generator have similar output stages running on the same power supply or on equal power supply voltages.

Making |V4−V3≈V2−V1|, i.e., making the differential components different in amplitude, will introduce a baseline a.c. component into the differential drive signal DDRV. The RMS value of the baseline a.c. component is determined using the expression indicated above, and is independent of the digital input value $D_{IN}$.

The DC level of the DC component of the differential drive signal is zero when (V1+V2)/2=(V3+V4)/2, i.e., when the differential components have the same average voltage. In particular, the DC level of the DC component is zero when V1=V3=0 and V2=V4, or V2=V4=0 and V1=V3. These conditions apply, for example, in the examples described above in which the first differential component generator and the second differential component generator have similar output stages running on the same power supply or on equal power supply voltages.

Making (V1+V2)/2≈(V3+V4)/2 will introduce a DC component into the differential drive signal DDRV. The level of the DC component is determined using the expression indicated above, and is independent of the digital input value $D_{IN}$.

Making the differential components differ both in amplitude and average level will introduce both a baseline a.c. component and a DC component into the differential drive signal DDRV with an RMS value and DC level determined as described above.

As noted above, the differential component waveform generator 530 that forms part of the second differential component generator 504 may have a structure similar to that of the differential component waveform generator 640 just described. Such differential component waveform generator would include a reference voltage generator that generates the voltages V3 and V4. Alternatively, the differential component waveform generators 520 and 530 may collectively include a reference voltage generator that generates appropriate values of the voltages V1-V4.

A simplified embodiment of the differential drive circuit 500 includes a differential component waveform generator structured as shown in FIG. 7A in only one of the differential component generators 502 and 504. For example, the differential component waveform generator is included only in the second differential component generator 504. In this, the first differential component D1 alternates between voltages V1 and V2 defined by the power supply voltage applied to the counter 103. To include a baseline a.c. component in the differential drive signal, the voltages V3 and V4 generated by the reference voltage generator that forms part of the differential component waveform generator are chosen to differ symmetrically from the voltages V1 and V2 between which the first differential component D1 alternates. Such choice of voltages V3 and V4 makes the average voltage of the second differential component equal to that of the first differential component.

To include a DC component in the differential drive signal, the voltages V3 and V4 generated by the reference voltage generator are chosen to differ asymmetrically from the voltages V1 and V2 between which the first differential component D1 alternates. Such choice of voltages V3 and V4 makes the average voltage of the second differential component different from that of the first differential component.

Figure 8:
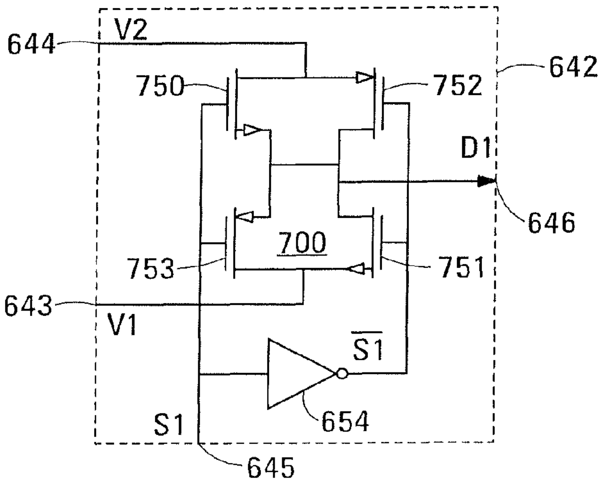
FIG. 8 is a schematic diagram of an example of the switch that forms part of the differential component waveform generator shown in FIG. 7A.

FIG. 8 shows an exemplary embodiment 700 of the controlled change-over switch 642 based on complementary metal-oxide-semiconductor (CMOS) transistors. Suitable alternative circuits are known in the art and can be used.

The switch 700 is composed of the N-type MOS (NMOS) transistors 750 and 751, the P-type MOS (PMOS) transistors 752 and 753, and the inverter 754. The NMOS transistor 750 is connected in series with the PMOS transistor 753 with their sources connected. The PMOS transistor 752 is connected in series with the NMOS transistor 751 with their drains connected. The series combination of the transistors 750 and 753 is connected in parallel with the series combination of the transistors 752 and 751 between the input terminals 644 and 643. The sources of the transistors 750 and 753 are connected to the drains of the transistors 752 and 751 and to the output 646. The control input 645 is connected to the gates of the transistors 750 and 753, and to the input of the inverter 754. The output of the inverter is connected to the gates of the transistors 752 and 751.

Figure 7B:
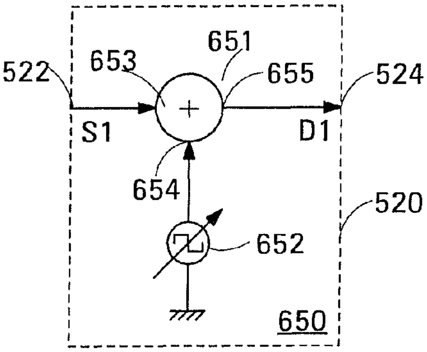
FIG. 7B is a block diagram of a second exemplary embodiment of the differential component waveform generator of the differential drive circuit according to the invention shown in FIG. 6.

FIG. 7B is a block diagram of a second exemplary embodiment 650 of the differential component waveform generator 520 shown in FIG. 6. The differential component waveform generator 650 generates the first differential component with a defined amplitude and a defined average voltage. In the example shown, the differential component waveform generator 650 generates the first differential component with a waveform that differs symmetrically in amplitude from that of the second differential component. As a result, the differential drive signal DDRV includes a baseline a.c. component whose RMS value is defined independently of the digital input value $D_{IN}$. The symmetrical difference in the amplitude of the differential component leaves the average voltage of the differential component D1 unchanged, and no DC component is introduced into the differential drive signal. As will be described below, the differential component waveform generator 650 may additionally or alternatively generate the first differential component with a waveform that differs asymmetrically in amplitude from that of the second differential component. Elements of the differential component waveform generator 650 that correspond to elements of the differential component waveform generator described above with reference to FIG. 6 are indicated using the same reference numerals and will not be described again here.

The differential component waveform generator 650 is composed of the adder 651 and the baseline signal generator 652. The adder includes the signal inputs 653 and 654 and the signal output 655. The signal input 653 is connected to the first synchronizing signal input 522. The signal input 654 is connected to the output of the baseline signal generator. The signal output 655 is connected to the first differential component output 524 and provides the first differential component D1.

The baseline signal generator 652 generates the baseline signal. To generate the differential drive signal DDRV' to include an a.c. baseline component, the baseline signal generator generates an a.c. signal as the baseline signal. The adder 651 adds the baseline signal to the first synchronizing signal S1 to generate the first differential component D1, and feeds the first differential component from its signal output 655 to the first differential component output 524.

The amplitude of the baseline signal generated by the baseline signal generator 652, and the amplitude ratio between the baseline signal and the first synchronizing signal S1, collectively determine the RMS value of the baseline a.c. component of the differential drive signal DDRV. The amplitude ratio between the baseline signal and the first synchronizing signal S1 determines the range of the RMS value of the baseline component of the differential drive signal DDRV'. In an example in which the amplitude ratio is unity, the maximum amplitude of the baseline signal is comparable with the amplitude of the differential components D1 and D2.

The baseline signal generator 652 is shown in FIG. 7B as a variable-amplitude signal generator. However, this is not critical to the invention. In applications in which the RMS value of the baseline component of the differential drive signal DDRV' is fixed, the baseline signal generator may generate the baseline signal with a fixed amplitude.

The baseline signal generator 652 is shown in FIG. 7B as a square-wave generator. The baseline signal generator may alternatively generate other a.c. waveforms, such as a sine wave, a triangle wave, a sawtooth wave and a trapezoidal wave. Any DC component in the baseline signal will appear as a DC component in the differential drive signal DDRV'. Thus, applications that require any DC component of the differential drive signal DDRV to be below a predetermined minimum value impose a maximum requirement on any DC component present in the baseline signal. Conversely, using a DC generator, or an a.c. generator whose output includes a DC component, as the baseline signal generator 652 will cause the differential drive signal DDRV to include a DC component having a DC level independent of the digital input value $D_{IN}$.

No relationship need exist between the frequency of the baseline signal generated by the baseline signal generator 652 and the frequency of the differential drive signal DDRV'.

Certain applications may impose constraints on the frequency of the baseline signal: for example, a minimum frequency limitation may be imposed on the baseline signal by the need to avoid flicker in a liquid crystal display.

Circuits for adding one signal to another are known in the art, so the adder 651 will not be described in further detail.

Figure 9A:
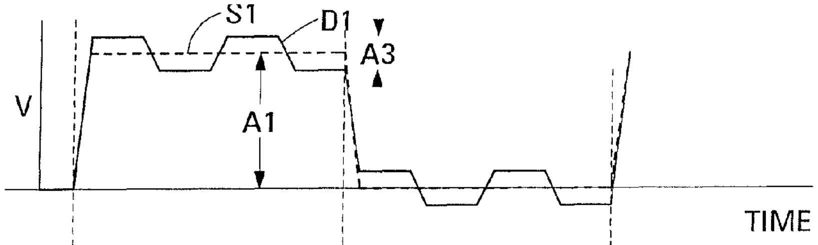
FIGS. 9A-9E are graphs illustrating the operation of the differential component waveform generator shown in FIG. 7B.

Operation of an example of the differential drive circuit 500 shown in FIG. 6 in which the first differential component generator 502 includes the differential component waveform generator 650 shown in FIG. 7B will now be described with reference to FIGS. 9A-9E. Operation with an a.c. baseline signal will be described. FIG. 9A shows a portion of the waveform of the first synchronizing signal S1 (broken line) output by the counter 103, and a corresponding portion of a first example of the waveform of the first differential component D1 (solid line) output by the adder 651. The waveform of the first differential component is the result of modulating the amplitude of the first synchronizing signal S1 with the baseline signal output by the baseline signal generator 652. The first synchronizing signal is a square wave having an amplitude A1. In this example, the baseline signal has the relatively low peak-to-peak amplitude A3 of about one-fourth of the amplitude A1.

Figure 9B:
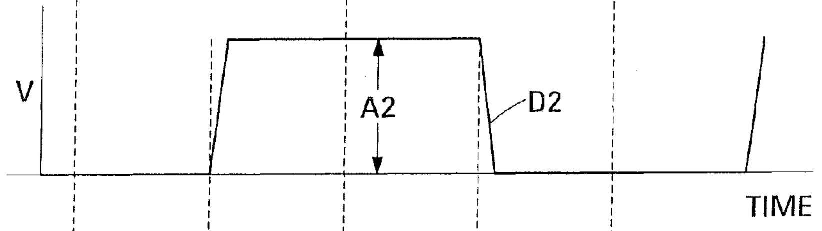

FIG. 9B shows a portion of an example of the second differential component D2 output by the second differential component generator 504. The second differential component D2 is a square wave having a frequency, average voltage and duty cycle equal to those of the first differential component D1 and an amplitude A2 equal to the amplitude A1 of the first synchronizing signal S1, but differing in phase from the first synchronizing signal. The phase difference is defined by the digital input value $D_{IN}$. The phase difference determines the component of the RMS value of the differential drive signal DDRV defined by the digital input value $D_{IN}$.

Figure 9C:
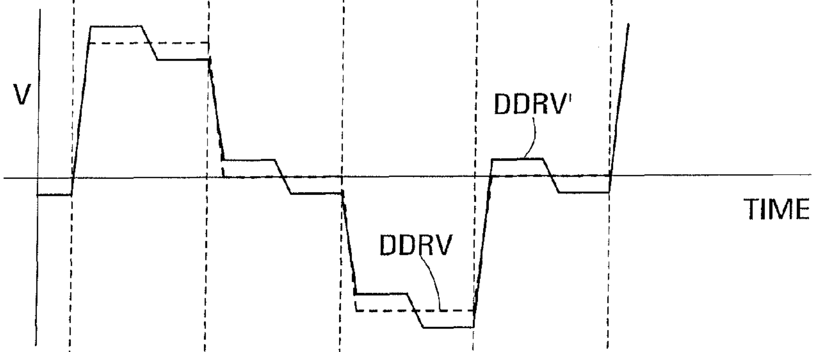

FIG. 9C shows the waveform of the differential drive signal DDRV' (solid line) whose differential components are the first example of the first differential component D1 shown in FIG. 9A and the second differential component D2 shown in FIG. 9B. Also shown for comparison is the waveform of the differential drive signal DDRV (broken line) whose differential components are the first synchronizing signal S1 shown in FIG. 9A and the second differential component D2 shown in FIG. 9B. The baseline a.c. component of the differential drive signal DDRV1' contributed by the baseline signal that forms part of the first differential component D1 increases the RMS value of the differential drive signal DDRV' relative to the RMS value of the original differential drive signal DDRV.

Figure 9D:
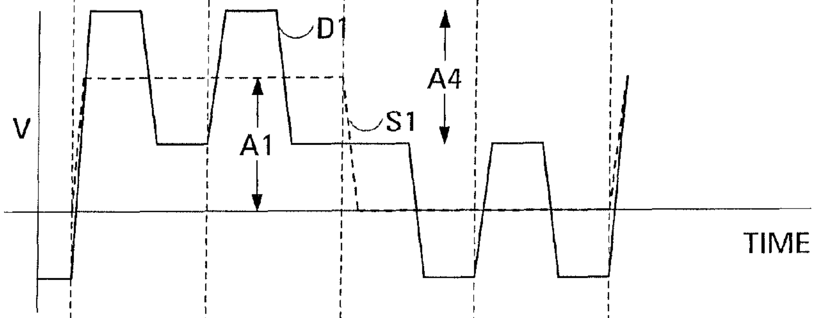

FIG. 9D shows a portion of the waveform of the first synchronizing signal S1 (broken line) output by the counter 103, and a corresponding portion of a first example of the waveform of the first differential component D1 (solid line) output by the adder 651 of the differential component waveform generator 650. In this example, the modulation imposed on the first synchronizing signal S1 by the baseline signal has the relatively high peak-to-peak amplitude A4, which is approximately equal to A1.

Figure 9E:
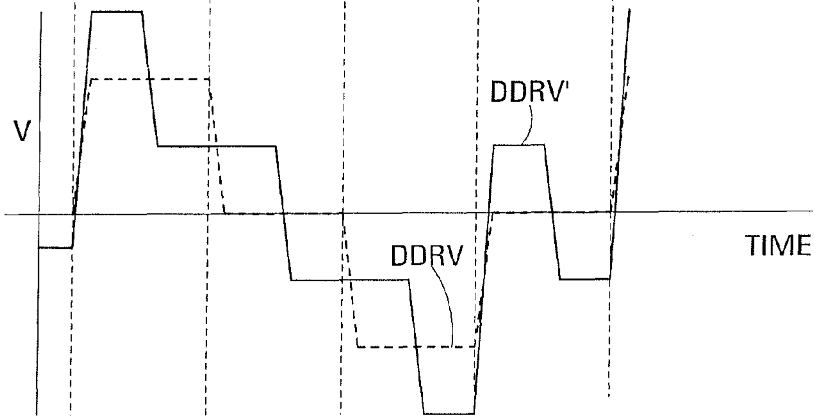

FIG. 9E shows the waveform of the differential drive signal DDRV (solid line) whose differential components are the example of the first differential component D1 shown in FIG. 9D and the second differential component D2 shown in FIG. 9B. Also shown for comparison is the waveform of the differential drive signal DDRV (broken line) whose differential components are the first synchronizing signal S1 shown in FIG. 9D (broken line) and the second differential component D2 shown in FIG. 9B. The baseline a.c. component of the differential drive signal originating from the baseline signal that forms part of the first differential component D1 substantially increases the RMS value of the differential drive signal DDRV' relative to the RMS value of the differential drive signal DDRV.

FIGS. 9C and 9E illustrate how the baseline signal increases the RMS value of the differential drive signals DDRV' independently of the digital input value $D_{IN}$. These figures additionally show that, notwithstanding their greater RMS value relative to the differential drive signal DDRV, the differential drive signals DDRV' have an average voltage of zero, and are therefore pure a.c. signals.

The differential component waveform generator 530 that forms part of the second differential component generator 504 may also be structured as shown in FIG. 7B. An arrangement in which both differential component waveform generators 520 and 530 are structured as shown in FIG. 7B enables the differential drive circuit 500 to generate the differential drive signal DDRV' to include two, independently-controlled baseline a.c. components, for example. Typically, however, the differential component waveform generator 530 generates the second differential component D2 with the fixed amplitude shown in FIG. 9B. As a further alternative, only one of the differential component generators 502 and 504 may include a differential component waveform generator structured as shown in FIG. 7B, and the other differential component generator may output the respective synchronizing signal as the respective differential component, as described above.

Figure 7C:
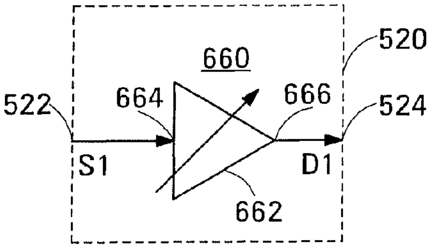
FIG. 7C is a block diagram of a third exemplary embodiment of the differential component waveform generator of the differential drive circuit according to the invention shown in FIG. 6.

FIG. 7C is a block diagram of a third exemplary embodiment 660 of the differential component waveform generator 520. The differential component waveform generator 660 generates the first differential component with a defined amplitude and a defined average voltage and that differs symmetrically in amplitude from that of the second differential component. As a result, the differential drive signal DDRV includes a baseline a.c. component whose RMS value is defined independently of the digital input value $D_{IN}$. The symmetrical difference in the amplitude of the differential component leaves the average voltage of the differential component unchanged, and no DC component is introduced into the differential drive signal. Elements of the differential component waveform generator 660 that correspond to elements of the differential component waveform generator described above with reference to FIG. 6 are indicated using the same reference numerals and will not be described again here.

The differential component waveform generator 660 is composed of the amplifier 662. In the example shown, the amplifier is a variable-gain amplifier. The amplifier includes the input 664 and the output 666. The input 664 is connected to the first synchronizing signal input 522. The output 666 is connected to the first differential component output 524 and provides the first differential component D1.

The differential component waveform generator 660 receives the first synchronizing signal S1. Typically, the first synchronizing signal has the same frequency, amplitude and duty cycle as the second differential component D2 generated by the second differential component generator 504. The amplifier 662 amplifies the first synchronizing signal S1 to generate the first differential component D1. As used in this disclosure, the term amplify encompasses amplification by a gain of less than unity, i.e., attenuation. As a result of the amplification, the first differential component alternates symmetrically about the average value of the second differential component with an amplitude different from that of the second differential component. The gain of the amplifier defines the RMS value of the baseline a.c. component of the differential drive signal. When the gain is unity, the RMS value of the baseline a.c. component is zero.

The amplifier 662 is described above as a variable-gain amplifier. However, this is not critical to the invention. In applications is which the RMS value of the baseline a.c. component of the differential drive signal DDRV' is fixed, the amplifier 662 may be a fixed-gain amplifier.

Figure 7D:
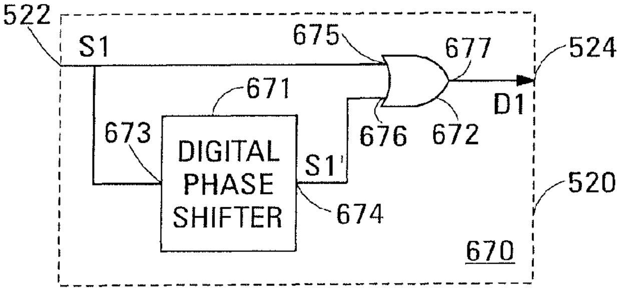
FIG. 7D is a block diagram of a exemplary fourth embodiment of the differential component waveform generator of the differential drive circuit according to the invention shown in FIG. 6.

FIG. 7D is a block diagram of a fourth exemplary embodiment 670 of the differential component waveform generator 520 shown in FIG. 6. The differential component waveform generator 670 generates the first differential component with a waveform that differs in duty cycle from that of the first synchronizing signal. As a result, the first differential component differs in average voltage from the second differential component, and the differential drive signal DDRV' includes a DC component whose value is defined independently of the digital input value $D_{IN}$.

The differential component waveform generator 670 will be described with reference to FIGS. 6 and 7D. Elements of the differential component waveform generator 670 that correspond to elements of the differential component waveform generator described above with reference to FIG. 6 are indicated using the same reference numerals and will not be described again here.

The differential component waveform generator 670 is composed of the phase shifter 671 and the OR gate 672. The phase shifter includes the synchronizing signal input 673 and the phase-shifted synchronizing signal output 674. The synchronizing signal input 673 is connected to the first synchronizing signal input 522.

The OR gate 672 includes the inputs 675 and 676 and the output 677. The input 675 is connected to the first synchronizing signal input 522 and the input 676 is connected to the phase-shifted synchronizing signal output 674 of the phase shifter 671. The output 677 is connected to the first differential component output 524 and provides the first differential component D1.

In the differential component waveform generator 670, the phase shifter 671 receives the first synchronizing signal S1. The phase shifter shifts the phase of the first synchronizing signal to generate the phase-shifted synchronizing signal S1'. The phase shifter may shift the phase of the first synchronizing signal by a fixed phase shift. A fixed phase shift imposes a DC component having a fixed DC level on the differential drive signal DDRV'. Alternatively, the phase shifter may shift the phase of the first synchronizing signal by a phase shift determined by an external input (not shown) to enable the DC level of the DC component of the differential drive signal DDRV' to be controlled.

Figure 10A:
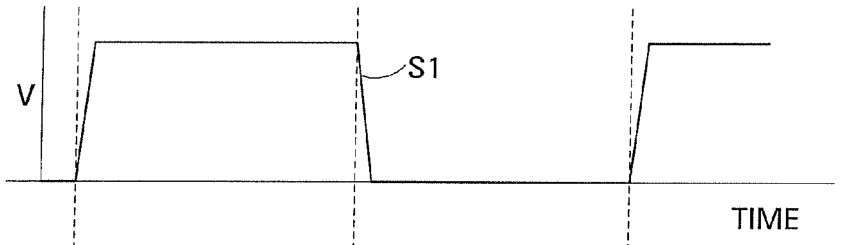
FIGS. 10A-10E are graphs illustrating the operation of the differential component waveform generator shown in FIG. 7D.
Figure 10B:
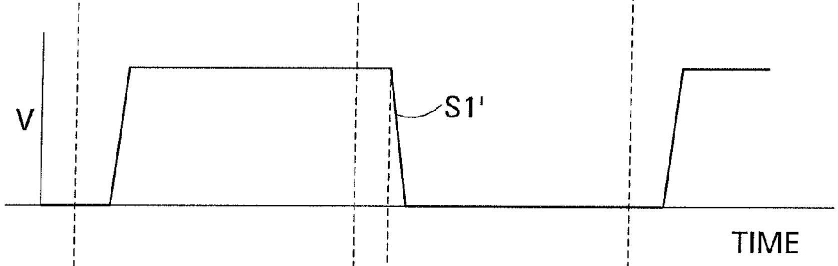

Operation of the differential drive circuit 670 will now be described with reference to FIGS. 10A-10E. The synchronizing signal S1 output by the counter 103 and the phase-shifted synchronizing signal S1' output by the phase shifter 671 are each square waves with a duty cycle of 50%. An example of the waveform of the first synchronizing signal is shown in FIG. 10A. The waveform of the phase-shifted synchronizing signal S1', shown in FIG. 10B, output by the phase shifter 671 is the same as that of the first synchronizing signal S1 in frequency, amplitude and duty cycle, but is delayed by a delay time defined by the phase shifter 671.

Figure 10C:
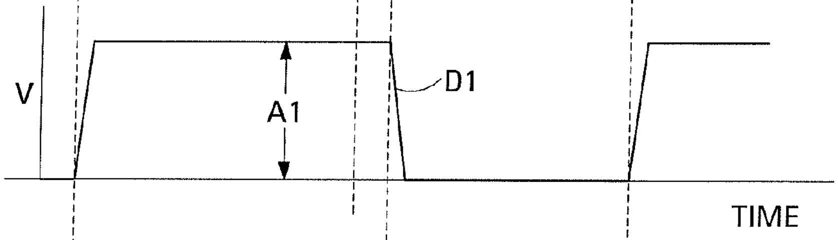

FIG. 10C shows the waveform of the first differential component D1 output by the OR gate 672. The first differential component changes state from low to high when the first synchronizing signal S1 changes state from low to high, and remains in its high state until the phase-shifted synchronizing signal S1' output by the phase shifter 671 changes state from high to low, whereupon the first differential component D1 reverts to its low state. Accordingly, the first differential component D1 has an duty cycle that differs from that of the first synchronizing signal S1 by an amount defined by the phase shift imposed on the first synchronizing signal by the phase shifter 671.

Figure 10D:
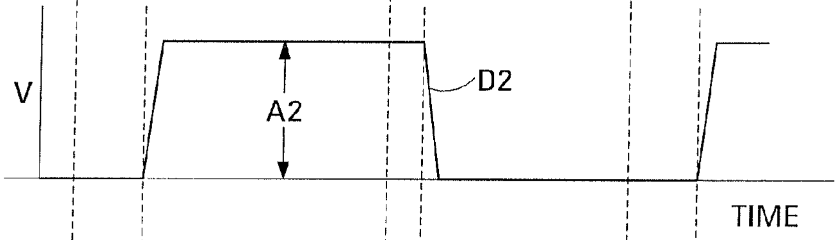

FIG. 10D shows the second differential component D2 output by the second differential component generator 504.

Figure 10E:
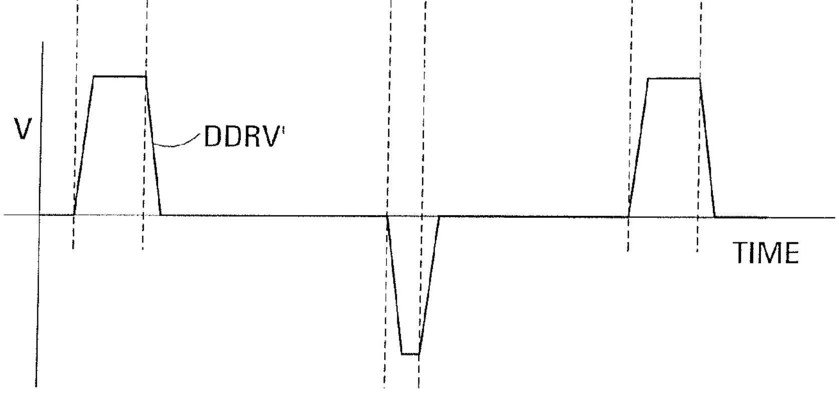

FIG. 10E shows the differential drive signal DDRV resulting from the difference between the first differential component D1 and the second differential component D2 when the differential components are equal in amplitude. In the example shown, the first differential component D1 has a duty cycle of greater than 50%. As a result, the portions of the differential drive signal at a voltage greater than zero are longer in duration than the portions at a voltage less than zero, and the differential drive signal includes a DC component having a DC level defined by the phase shift imposed by the phase shifter 671.

In the example of the differential component waveform generator 670 shown in FIG. 7D, the gate 672 is an OR gate. However, the gate 672 may alternatively be an AND gate, a NOR gate or a NAND gate.

The differential component waveform generator 670 shown in FIG. 7D generates the first differential component with a duty cycle different from 50%. In a differential drive circuit configured for driving an array of electrodes, such as that shown in FIG. 5, first differential component having a duty cycle different from 50% applies a DC component to the common electrode, and, hence, to all the cells in the array. The duty cycle of the second differential component D2 may additionally or alternatively be made different from 50%. In a differential drive circuit configured for driving an array of electrodes, each second differential component having a duty cycle different from 50% provides the ability to apply a DC component of a different DC level to each cell of the array. Each second differential component generator may include an instance of the differential component waveform generator 670 that generates the second differential component D2 with a waveform having a duty cycle different from 50%.

Circuit arrangements different from those described above may alternatively be used to generate at least one of the differential components with a duty cycle that differs from that of the corresponding synchronizing signal and, hence, that additionally differs from that of the other differential component to generate the differential drive signal DDRV to include a DC component.

The invention has been described above with reference to examples in which the digital input value $D_{IN}$ is a B-bit word and the successive values of the count CNT are B− or (B+1)-bit words. However, this is not critical to the invention. A digital input value of B bits is capable of defining one of a total of $2^B$ different RMS values of the differential drive signal. Digital input values that differ by one least-significant bit define differential drive signals that differ in RMS value by one part in $2^B$.

As an alternative to a digital input value of B bits defining one of a possible $2^B$ different RMS values, the digital input value may alternatively be composed of P bits, where P is less than B. Such a digital input value can be used to define a subset composed of $2^P$ of the $2^B$ possible different RMS values. The subset is commonly referred to as a palette. The RMS values in the palette may differ from one another by as little as one part in $2^B$.

Techniques for converting a digital input value that represents a quantity using B bits to represent the quantity using a palette of fewer levels capable of representation by P bits are known in the art, and will not be described here. See, for example, U.S. Pat. No. 4,232,311 to Agneta, U.S. Pat. No. 4,484,187 to Brown et al. and U.S. Pat. No. 4,710,806 to Iwai et al. Such techniques generate a palette code table in which each element of the palette represents a range of digital input values and is identified by an P-bit palette code.

The paletized approach simplifies the second differential component generator of the differential drive circuit according to the invention since the digital phase shifter can be configured to handle fewer bits. Moreover, when the second differential component generator includes a memory to store the digital input value, such memory can also be configured to store fewer bits. Finally, the busses that convey the digital input value and the count to the second differential component generator can be simplified since they are required to transmit fewer bits.

Figure 11A:
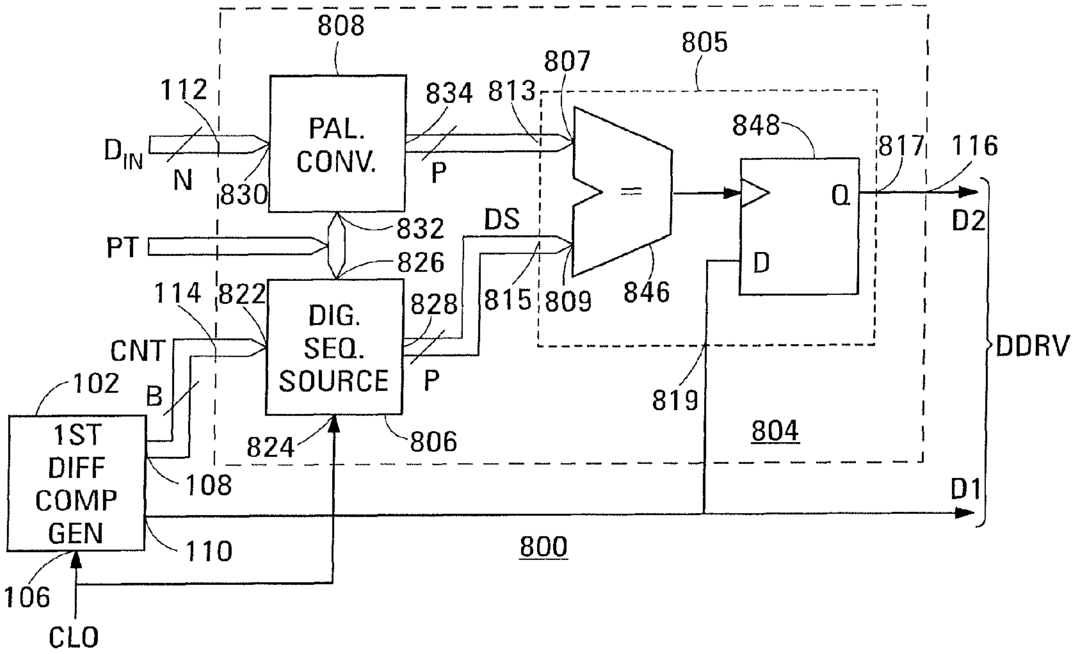
FIG. 11A is a block diagram of a fourth embodiment of a differential drive circuit according to the invention.

FIG. 11A is a block diagram of a fourth embodiment 800 of a differential drive circuit according to the invention. In this, the second differential component generator is structured to operate with fewer bits than the number of bits that define the resolution of the RMS value of the differential drive signal. Elements of the differential drive circuit 800 that correspond to elements of the differential drive circuit described above with reference to FIG. 1 and of the digital phase shifters described above with reference to FIGS. 4A and 4B are indicated using the same reference numerals and will not be described again here.

In the differential drive circuit 800, the second differential component generator 804 is composed of the digital phase shifter 805, the digital sequence source 806 and the palette converter 808.

The digital phase shifter 805 includes the palette code input 813, the digital sequence input 815, the second synchronizing signal output 817 and the first differential component input 819. The first differential component input is connected to the first differential component output 110 of the first differential component generator 102. The second synchronizing signal output 817 is connected to the second differential component output 116 of the second differential component generator 804.

The digital sequence source 806 includes the count input 822, the clock input 824, the palette table input 826 and the digital sequence output 828. The count input 822 is connected to the count input 114 of the second differential component generator 804. The clock input 824 is connected to receive the clock signal CLO. The palette table input 826 is connected to receive a palette table PT that defines a palette code for each possible value of the digital input value $D_{IN}$. Alternatively, the palette code table may define a range of possible values of the digital input value corresponding to each palette code. The digital sequence output 828 is connected to the digital sequence input 815 of the digital phase shifter 805.

The palette converter 808 includes the digital input value input 830, the palette table input 832 and the palette code output 834. The digital input value input 830 is connected to receive the digital input value $D_{IN}$. The digital input value is an N-bit word, where N>P. For example, the digital input value may be a B-bit word, where B is the number of bits constituting the successive values of the count CNT. However, this is not critical to the invention. The palette table input is connected to receive the palette table, described above. The palette code output is connected to the palette code input 813 of the digital phase shifter 805. The palette code is a P-bit word.

The digital sequence source 806, which will be described in more detail below, receives the B-bit count CNT from the first differential component generator 102, the clock signal CLO and the palette table PT and, in response to them, generates a sequence of $2^B$ words in which each palette code in the palette code table is located at a point in the sequence corresponding to the one of the digital input values represented by the palette code. For example, assume that the digital input values represented by the palette codes are 4-bit words, i.e., B=4, and that the palette code is a 2-bit word, i.e., P=2. In this example, the differential drive signal DDRV has 16 possible RMS values of which a subset of $\{(2^2-1)=3\}$ RMS values is represented by the palette codes.

One of the palette codes is reserved and is not available to represent a digital input value. In this example, the palette code 0 is reserved. The remaining three palette codes 1, 2 and 3 represent three digital input values, namely, a, b and c, respectively. Each of the digital input values represented by one of the palette codes is in the range from 0 to 15. An exemplary palette code table is shown in Table 1:

TABLE 1

| Palette Code | Digital Input Value Represented by Palette Code |
|---|---|
| 0 | reserved |
| 1 | 4 |
| 2 | 1 |
| 3 | 12 |

The digital sequence DS has a temporal duration equal to one half cycle of the first differential component D1. The digital input value $D_{IN}$ is a 4-bit word, so defines one of 16 discrete values as the phase difference between the first differential component D1 and the second differential component D2 of the differential drive signal DDRV. The 16 discrete values of the phase difference correspond to 16 discrete temporal points in the digital sequence. Such temporal points are defined by the counter 102 generating the count CNT with 32 different values, of which 16 different values are in each half-cycle of the first differential component. The digital sequence source 806 then locates each palette code at the point in the digital sequence temporally corresponding to the phase difference defined by the digital input value represented by the palette code. In the example just described, the palette codes 1, 2 and 3 are located at points in the digital sequence 4 clock cycles, 1 clock cycle and 12 clock cycles, respectively, from the start of each half of the count.

As shown in Table 1, there is no need for the palette codes to increase in the order of the digital input values they represent, e.g., when the digital input values represented by the palette codes 1, 2 and 3 are as exemplified in Table 1, the order of the palette codes in the digital sequence is 2, 1, 3. The locations in the digital sequence that correspond to phase differences defined by none of the digital input values in the palette can be filled with the reserved palette code, i.e., the palette code 0 in this example. Alternatively and as exemplified below, each palette code can be repetitively inserted into the digital sequence until the next palette code is inserted. The reserved palette code is inserted into the digital sequence up to the location at which the palette code that identifies the smallest phase difference is inserted. In the above example, since the palette code 2 represents a digital input value of 1, the reserved palette code is inserted only into location 0 of the digital sequence.

The palette converter 808 receives the digital input value $D_{IN}$ at the digital input value input 830 and, in response thereto, feeds the palette code corresponding to the digital input value from the palette code output 834 to the palette code input 813 of the digital phase shifter 805. In the above example, the palette converter will output palette codes of 1, 2 or 3 in response to receiving a digital input value in a first range that includes 4, a second range that includes 1 and a third range that includes 12, respectively, where the ranges are non-overlapping and collectively extend from 0 to $(2^B-1)$.

The structure of the digital phase shifter 805 is similar to that of the digital phase shifter 305 described above with reference to FIG. 4A, except that the comparator 846 is a P-bit comparator instead of a B-bit comparator. The output of the comparator changes state when the digital sequence becomes equal to the palette code. In an embodiment in which a memory (not shown) is interposed between the palette code input 813 and the input 807 of the comparator, such memory is a P-bit memory instead of a B-bit memory.

A version of the differential drive circuit 800 that generates multiple differential drive signals may be based on the differential drive circuit 400 shown in FIG. 5. Such differential drive circuit is composed of the first differential component generator 102, the digital sequence source 806, the palette converter 808, Q digital phase shifters 805, where Q is the number of differential drive signals to be generated, and a palette code distributor analogous to the digital input value distributor 438 but handing P-bit palette codes instead of B-bit digital input values.

Figure 11B:
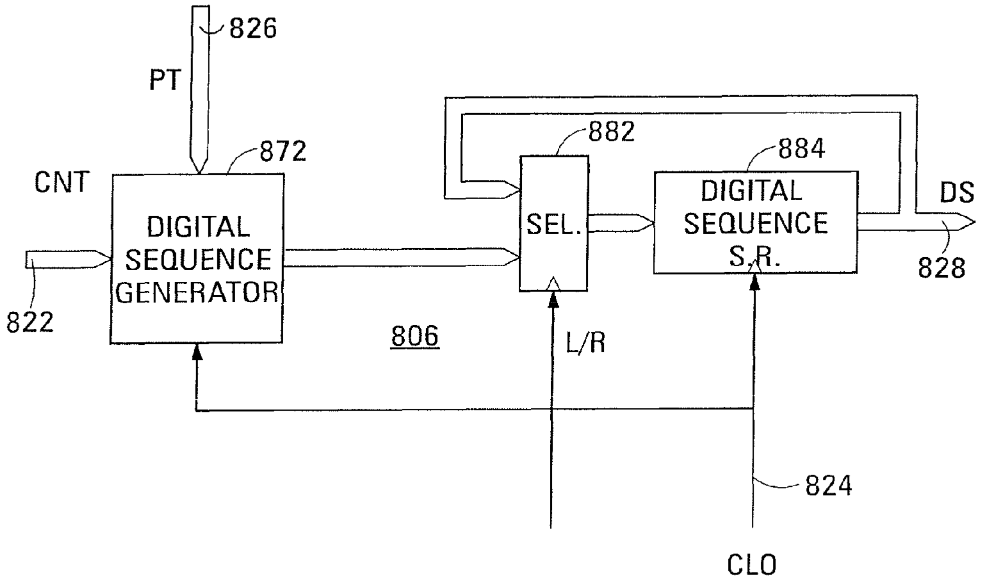
FIG. 11B is a block diagram of an example of the digital sequence source of the differential drive circuit shown in FIG. 11A.
Figures 12A, 12B, 12C, 12D, 12E, 12F, 12G, 12H:
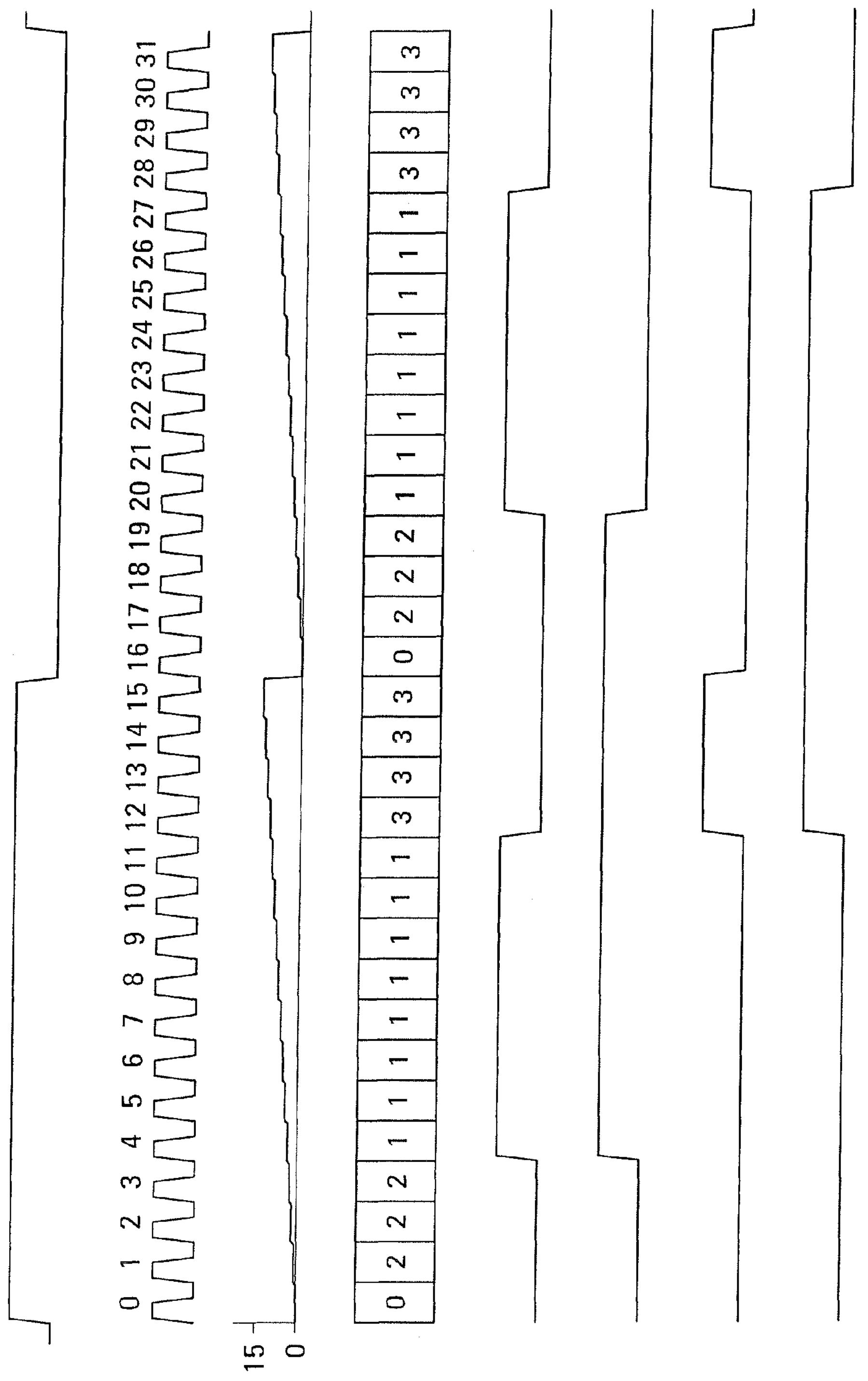
FIGS. 12A-12H are graphs illustrating the operation of the differential drive circuit shown in FIG. 11A.

FIG. 11B is a block diagram of an example of the digital sequence source 806. The digital sequence source is composed of the digital sequence generator 872, the selector 882 and the digital sequence shift register 884. The digital sequence source receives a palette code table PT at the palette table input 832, the count CNT at the count input 822 and derives from the palette code table the digital sequence DS synchronized to the count. An exemplary digital sequence is shown in FIG. 12D, to be described below.

The digital sequence generator 872 receives each new palette code table PT from the palette table input 832 and, in response to the new palette code table, the count CNT received via the count input 822 and the clock input CLO received via the clock input 824, generates a new digital sequence corresponding to the new palette code table.

Each new digital sequence generated by the digital sequence generator 872 is fed via the selector 882 into the digital sequence shift register 884. After the digital sequence has been loaded, the state of the selector is changed to recirculate the digital sequence through the digital sequence shift register. The digital sequence shift register repetitively feeds the digital sequence to the digital sequence output 828, and continues to do so until a the digital sequence generator generates another new digital sequence and the new digital sequence is loaded into the digital sequence shift register.

Operation of the differential drive circuit 800 will now be described with reference to FIGS. 11A and 12A-12H. In the example shown, the digital input value is a 4-bit word, and the palette converter represents the digital input value as a 2-bit palette code. Consequently, the circuitry of the digital phase shifter 805 is two-bit circuitry, and the digital sequence source 806 generates a digital sequence composed of 16 two-bit words. In other words, B=4 and P=2 in this example.

FIG. 12A shows one cycle of the first differential component D1 to which operation of the differential drive circuit 800 is synchronized.

FIG. 12B shows the 32 periods of the clock signal CLO corresponding to the single cycle of the first differential component shown in FIG. 12A.

FIG. 12C shows the value of the less-significant bits LB of the count CNT corresponding to the 32 periods of the clock signal CLO shown in FIG. 12B.

FIG. 12D shows the digital sequence output by the digital sequence source 806 in response to the first differential component D1, the clock signal CLO and the exemplary palette table PT shown in Table 1. The digital sequence is composed of 16, i.e., $2^B$, P-bit words. The digital sequence has a temporal duration corresponding to one half-cycle of the first differential component D1. The digital sequence is synchronized to the first differential component D1: the digital sequence begins each time the first differential component changes state, as can be seen by comparing FIG. 12D with FIG. 12A.

In the example shown, the initial word of the digital sequence is the reserved palette code 0. At cycle 1 of the clock signal CLO, the words of the digital sequence change to 2, since the palette code 2 represents a digital input value of 1. At clock cycle 4, the words of the digital sequence change to 1, since the palette code 1 represents a digital input value of 4. Finally, at clock cycle 12, the words of the digital sequence change to 3, since the palette code 3 represents a digital input value of 12. The words of the digital sequence remain 3 for the remainder of the digital sequence that extends to clock cycle 15.

The palette converter 862 generates a palette code in response to the digital input value $D_{IN}$, and feeds the palette code to the second differential component generator 804. Two examples of the operation of the differential drive circuit will be described. In the first example, the palette code is 1, which represents the digital input value of 4. In the second example, the palette code is 3, which represents the digital input value of 12.

FIG. 12E shows the output of the comparator 846 of the digital phase shifter 805 in the first example, in which the palette code is 1. The output of the comparator is in its 0 state during clock cycles 0-3. The palette code 1 first appears in the digital sequence at clock cycle 4. This causes the output of the comparator to change to its 1 state.

FIG. 12F shows the second differential component D2. The change in state of the output of the comparator 842 clocks the 1 state of the first differential component D1 to the Q output of the flip-flop 848. As a result, the second differential component D2 output by the flip-flop 848 changes to the 1 state.

The output of the comparator 846 remains in its 1 state until clock cycle 12, when the palette code 3 first appears in the digital sequence. Consequently, the comparator output reverts to its 0 state. However, this negative-going transition does not clock the flip-flop 848, and the second differential component D2 remains in its 1 state.

When the first differential component D1 shown in FIG. 12A changes state at clock cycle 16, as shown in FIG. 12B, the digital sequence shown starts to repeat, as shown in FIG. 12D. The output of the comparator 842 remains in its 0 state, as shown in FIG. 12E, until clock cycle 20, when the palette code 1 again appears in the digital sequence. The output of the comparator then changes state from 0 to 1. This transition clocks the 0 state of the first differential component D1 to the Q output of the flip-flop 846 to cause the second differential component D2 generated by the flip-flop to change to the 0 state, as shown in FIG. 12F.

FIGS. 12G and 12H show the output of the comparator 846 and the Q output of the flip-flop 848 in the second example, in which the palette code is 3. In this example, the first appearance of palette code 3 in the digital sequence shown in FIG. 12D is at clock cycle 12. As a result, the output of the comparator changes from 0 to 1 at clock cycles 12 and 28, and from 1 to 0 at clock cycles 15 and 31, as shown in FIG. 12G. The Q output of the flip-flop and, hence, the second differential component D2, change from 0 to 1 at clock cycle 12, and from 1 to 0 at clock cycle 28, as shown in FIG. 12H.

Thus, the second differential component generator 804 generates the second differential component D2 phase delayed relative to the first differential component by the number of clock cycles equal to the digital input value that corresponds to the palette code received by the digital phase shifter 805, i.e., 4 in the first example and 12 in the second example. The RMS value of the differential drive signal DDRV is therefore defined by the digital input value that corresponds to the palette code received by the second differential component generator.

In some applications, the digital input value $D_{IN}$ received by the second differential component generator 804 is a palette code. In this case, the palette converter 808 may be omitted and the palette code received at the digital input value input 112 of the second differential component generator can be fed directly to the palette code input 813 of the digital phase shifter 805.

Either or both of the differential component generators 102 and 804 may be structured in a manner similar to that shown in FIG. 6 to include a differential component waveform generator that defines the waveform of the respective differential component. Exemplary differential component waveform generators are described above with reference to FIGS. 7A-7E.

Figure 13:
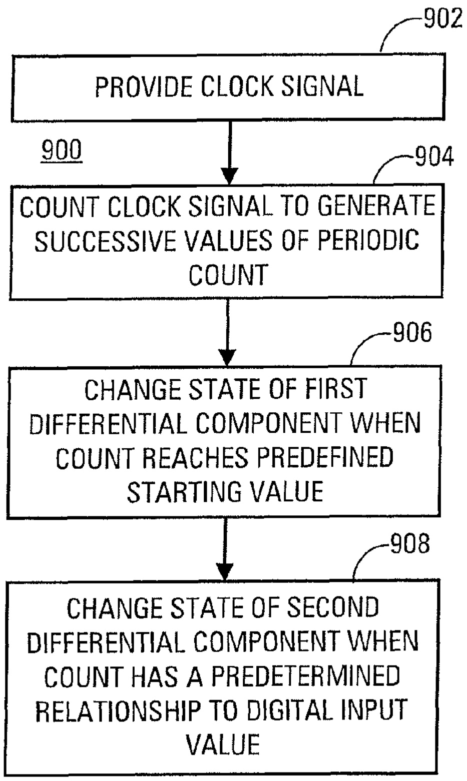
FIG. 13 is a flow chart illustrating a method according to the invention for generating a differential drive signal having a root mean square value defined by a digital input value.

FIG. 13 is a flow chart illustrating a method 900 according to the invention for generating a differential drive signal having a root mean square value defined by a digital input value. The differential drive signal includes a first differential component and a second differential component.

In process 902, a clock signal is provided.

In process 904, the clock signal is counted to generate successive values of a periodic count.

In process 906, the state of the first differential component is changed when the count reaches a predefined starting value.

In process 908, the state of the second differential component is changed when the count has a predetermined relationship to the digital input value.

In process 906, a preferred starting value is zero, but the starting value may be a value different from zero. The starting value is different from zero when the range of the digital input value does not include zero.

In process 908, a preferred relationship is equality. Alternative relationships include a predetermined difference. For example, the predetermined difference may be a difference of one least-significant bit.

The digital input value may be a Gray code value, and, in counting the clock signal, the successive values of the count may each be Gray code value.

In process 908, the phase of successive ones of the most-significant bit of the bit of the count is digitally phase shifted by a phase difference defined by the digital input value.

Figure 14A:
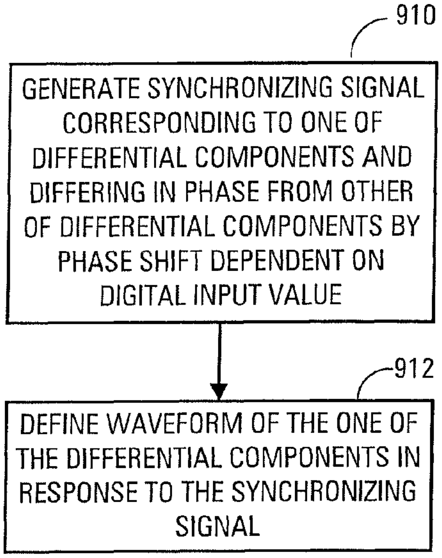
FIG. 14A is a flow chart of an additional process that may form part of the method shown in FIG. 13.

FIG. 14A is a flow chart of additional processes that may form part of the method shown in FIG. 13. In process 910, a synchronizing signal is generated corresponding to one of the differential components. The synchronizing signal differs in phase from the other of the differential components by a phase shift dependent on the digital input value.

In process 912, the waveform of the one of the differential components is defined in response to the synchronizing signal.

The waveform of the one of the differential components may be defined by generating the one of the differential components with a waveform differing from a square wave. For example, the waveform of the one of the differential components may be a sine wave, a triangle wave, a sawtooth wave or a trapezoidal wave.

The waveform of the one of the differential components may be defined by adding a baseband signal to the synchronizing signal, or by amplifying the synchronizing signal.

When the other of the differential components alternates between a first voltage and a second voltage, the waveform of the one of the differential components may be defined by alternating, the one of the differential components between a third voltage and a fourth voltage in response to the synchronizing signal. The third voltage and the fourth voltage differ substantially symmetrically from the first voltage and the second voltage, respectively, so that the differential components have substantially equal average voltages. Alternatively, the average of first voltage and the second voltage may be different from the average of the third voltage and the fourth voltage.

As a further alternative, the waveform of the one of the differential components may be defined by generating the one of the differential components with a duty cycle different from that of the corresponding synchronizing signal.

Figure 14B:
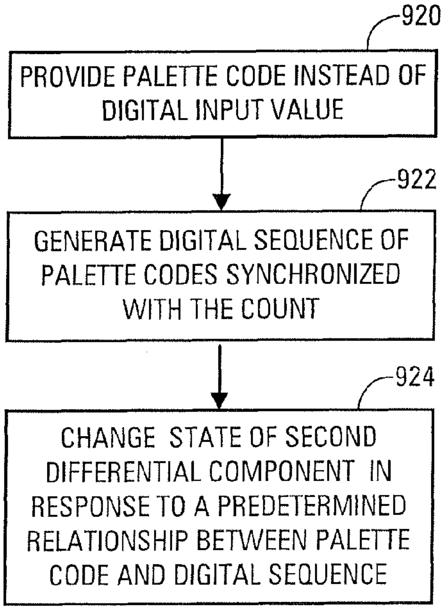
FIG. 14B is a flow chart an embodiment of process 808 of the method shown in FIG. 13.

FIG. 14B is a flow chart of an embodiment of process 908 of the method shown in FIG. 13. In this, in process 920, a palette code is provided instead of the digital input value.

In process 922, a digital sequence of palette codes synchronized with the count is generated.

In process 924, the state of the second differential component is changed in response to a predetermined relationship between the palette code and the digital sequence.

The invention has been described with reference to exemplary, highly-simplified embodiments that have various exemplary logic states, signal states and directions of transitions. However, the invention encompasses embodiments of any complexity having different logic states, signal states and directions of transitions from those illustrated.

The above-described embodiments of the differential drive circuit according to the invention may be constructed using discrete components, small-scale or large-scale integrated circuits or other suitable hardware.

Although this disclosure describes illustrative embodiments of the invention in detail, it is to be understood that the invention is not limited to the precise embodiments described, and that various modifications may be practiced within the scope of the invention defined by the appended claims.

What is claimed is:

1. A liquid crystal device, comprising:

a first electrode;

a second electrode;

a liquid crystal material sandwiched between the first electrode and the second electrode;

a counter connected to receive a clock signal and operating to count the clock signal to generate successive values of a periodic count, the successive values each including a most-significant bit and less-significant bits, and additionally to feed successive ones of the most-significant bit of the count to the first electrode as a first differential component; and second differential component generating means for receiving a digital input value and the successive values of the count, the second differential component generating means comprising a digital phase shifter operating in response to the digital input value and the periodic count, for generating a second differential component in response thereto and for feeding the second differential component to the second electrode, the second differential component comprises a signal differing in phase relative to the first differential component by a phase difference defined by the digital input value.

2. The liquid crystal device of claim 1, additionally comprising: a plurality of second electrodes; and a plurality of second differential component generating means each for receiving a respective digital input value and the successive values of the count, for generating a respective second differential component in response thereto and for feeding the second differential component to a respective one of the second electrodes.

3. The liquid crystal device of claim 2, additionally comprising means for distributing the respective digital input value to each of the plurality of second differential component generating means.

4. The liquid crystal device of claim 1, wherein the digital phase shifter comprises a comparator and a d-type flip flop.

5. The liquid crystal device of claim 1, wherein the digital phase shifter comprises a binary adder.

6. The liquid crystal device of claim 1, wherein the counter comprises a incrementor coupled to a register for producing the less-significant bits.

7. The liquid crystal device of claim 6, wherein the counter comprises a flip-flop coupled to the incrementor for generating the successive ones of the most-significant bit of the count.

8. The liquid crystal device of claim 1, wherein the digital input value is a Gray code value; and the count is a Gray code count.

9. A method for providing a liquid crystal device, the method comprising:

providing a first electrode;

providing a second electrode;

placing a liquid crystal material between the first electrode and the second electrode;

providing a counter connected to receive a clock signal;

counting the clock signal with the counter for generating successive values of a periodic count, the successive values each including a most-significant bit and less-significant bits;

feeding successive ones of the most-significant bit of the count to the first electrode as a first differential component; and receiving a digital input value and the successive values of the count;

generating a second differential component from the digital input value and successive values of the count with a digital phase shifter; and feeding the second differential component to the second electrode, the second differential component comprises a signal differing in phase relative to the first differential component by a phase difference defined by the digital input value.

10. The method of claim 9, further comprising providing a plurality of second electrodes; and providing a plurality of second differential component generating means each for receiving a respective digital input value and the successive values of the count, the second differential component generating means comprising a digital phase shifter, for generating a respective second differential component in response thereto and for feeding the second differential component to a respective one of the second electrodes.

11. The method of claim 10, further comprising distributing the respective digital input value to each of the plurality of second differential component generating means.

12. The method of claim 10, wherein the digital phase shifter comprises a comparator and a d-type flip flop.

13. The method of claim 10, wherein the digital phase shifter comprises a binary adder.

14. The method of claim 10, wherein the counter comprises a incrementor coupled to a register for producing the less-significant bits.

15. The method of claim 14, wherein the counter comprises a flip-flop coupled to the incrementor for generating the successive ones of the most-significant bit of the count.

16. The method of claim 9, wherein the digital input value is a Gray code value, and the count is a Gray code count.

* * * * *